United States Patent
Verdant et al.

(10) Patent No.: US 10,153,778 B2
(45) Date of Patent: Dec. 11, 2018

(54) HIGH-LINEARITY SIGMA-DELTA CONVERTER

(71) Applicant: Commissariat á l'Energie Atomique et aux Energies Alternatives, Paris (FR)

(72) Inventors: Arnaud Verdant, Saint-Nazaire-les-Eymes (FR); William Guicquero, Bures-sur-Yvette (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/659,170

(22) Filed: Jul. 25, 2017

(65) Prior Publication Data

US 2018/0034471 A1 Feb. 1, 2018

(30) Foreign Application Priority Data

Jul. 27, 2016 (FR) ...................... 16 57231

(51) Int. Cl.
*H03M 3/00* (2006.01)
(52) U.S. Cl.
CPC ........... *H03M 3/436* (2013.01); *H03M 3/358* (2013.01); *H03M 3/404* (2013.01); *H03M 3/412* (2013.01); *H03M 3/458* (2013.01); *H03M 3/39* (2013.01)
(58) Field of Classification Search
CPC ....... H03M 3/346; H03M 3/404; H03M 3/436
USPC ................. 341/143, 155, 118, 120
See application file for complete search history.

(56) References Cited

U.S. PATENT DOCUMENTS

| | | | |
|---|---|---|---|
| 5,241,310 A | 8/1993 | Tiemann | |
| 7,053,807 B1 | 5/2006 | Gaalaas | |
| 8,405,535 B1 | 3/2013 | Xiao et al. | |
| 2008/0297387 A1* | 12/2008 | Doerrer | H03H 11/1252 |
| | | | 341/143 |
| 2009/0289824 A1 | 11/2009 | Chen | |
| 2016/0197619 A1* | 7/2016 | Katayama | H03M 3/30 |
| | | | 341/143 |

FOREIGN PATENT DOCUMENTS

DE 19725171 A1 12/1998

OTHER PUBLICATIONS

Preliminary Search Report in French Patent Application No. 1657231 dated Apr. 19, 2017, 3 pages.

(Continued)

*Primary Examiner* — Peguy Jean Pierre
(74) *Attorney, Agent, or Firm* — Moreno IP Law LLC

(57) ABSTRACT

A sigma-delta converter including a sigma-delta modulator including at least one analog filter capable, for each cycle of a conversion phase, of receiving an internal analog signal originating from the analog input signal and of supplying an analog output signal, wherein: the contribution of the internal analog signal to the output value of the filter is smaller at a given cycle of the conversion phase than at a previous cycle, the contributions to the different cycles being governed by a first predetermined law which is a function of the rank of the cycle; and the duration of a given cycle of the conversion phase is shorter than the duration of a previous cycle, the durations of the different cycles being governed by a second predetermined law which is a function of the rank of the cycle in the conversion phase.

12 Claims, 12 Drawing Sheets

(56) References Cited

OTHER PUBLICATIONS

Zourntos T et al.; Stable One-Bit Delta-Sigma Modulators Based on Switching Control; Proceedings of the 1998 IEEE International Conference on Acoustics, Speech and Signal Processing; vol. CONF. 23; May 12, 1998.
Yao, Libin et al.; A High-Linearity Sigma-Delta Topology Suitable for Low-Voltage Applications; http://citeseerx.ist.psu.edu/viewdoc/download;jsessionid=9C31627DB868C831BFCBCC76F0E7E6E8?doi=10.1.1.6.2988&rep=rep1&type=pdf; Jan. 1, 2000.
Xu, Xiaochu et al.; Variable-Sampling-Rate Sigma-Delta Modulator for Instrumentation and Measurement; IEEE Transactions on Instrumentation and Measurement; vol. 44, No. 5; Oct. 1, 1995.

\* cited by examiner

HIGH-LINEARITY SIGMA-DELTA CONVERTER

This application claims the priority benefit of French patent application number 16/57231, the content of which is hereby incorporated by reference in its entirety to the maximum extent allowable by law.

BACKGROUND

The present disclosure relates to the field of analog-to-digital converters, and more particularly to sigma-delta converters.

DISCUSSION OF THE RELATED ART

A sigma-delta converter typically comprises a sigma-delta modulator and a digital filter. The analog signal to be digitized is applied at the modulator input and is sampled by the latter at a relatively high frequency (relative to the maximum frequency of the input signal), called oversampling frequency. The modulator generates, at the oversampling frequency, binary samples representative of the analog input signal. The output bit train of the sigma-delta modulator is processed by the digital filter which extracts therefrom a digital value over N bits (N being the quantization resolution of the sigma-delta converter). The number of binary samples (that is, the number of oversampling periods) necessary to generate a digital output value over N bits is designated with acronym OSR, for "Over Sampling Ratio".

The sigma-delta modulator is typically formed of a loop comprising at least an analog integration circuit, a 1-bit analog-to-digital converter, a 1-bit digital-to-analog converter, and a subtractor. The analog input signal is applied to the input of the integration circuit, which samples it at the oversampling frequency and supplies at this same frequency analog samples representative of the difference between the input signal and an analog feedback signal. The analog output samples of the integration circuit are digitized by the 1-bit analog-to-digital converter (typically, a comparator). The binary signals thus obtained from the output signal of the modulator. These binary samples are further converted into analog samples by the 1-bit digital-to-analog converter, the analog signal thus obtained forming the modulator feedback signal. The analog integration circuit may comprise a single analog integrator, or a plurality of cascaded analog integrators. It may also comprise one or a plurality of subtractors, one or a plurality of summing elements, and/or one or a plurality of weighting coefficients. Number p of analog integrators generally defines the order of the sigma-delta modulator. The higher order p of the modulator, the more number OSR of samples necessary to obtain a digital output value over N bits can be decreased (for identical quantization noise levels). On the other hand, sigma-delta modulators are all the more complex to form as their order is high (difficult stabilization).

The digital filter comprises, according to the modulator structure, one or a plurality of digital integrators (generally at least as many as there are analog integrators in the modulator), for example, counters, and carries out a filtering function intended to extract the useful information from the bit train generated by the sigma-delta modulator. More particularly, the sigma-delta modulator shapes the useful signal by means of its signal transfer function STF, and the quantization noise by means of its noise transfer function NTF. The STF is the transfer function linking the analog input signal to be digitized to the output signal of the modulator, and the NTF is the transfer function linking the quantization noise introduced by the 1-bit analog-to-digital converter of the modulator to the output signal of the modulator. The NTF enables to push the quantization noise out of the band of interest (where the signal is located). The digital filter is designed to extract the signal from frequency bands where the attenuation of the quantization noise by the NTF is high (that is, where the signal is located). The signal transfer function, STF, is generally equal to 1, and the noise transfer function, NTF, is for example expressed, for a modulator of order p, by $NTF(z)=(1-z^{-1})^p$.

There is a need to at least partly improve certain aspects of existing sigma-delta converters.

SUMMARY

Thus, an embodiment provides a sigma-delta converter capable of implementing a phase of conversion of an analog input signal into a digital output value, the conversion phase comprising a plurality of operating cycles, the converter comprising a sigma-delta modulator comprising at least one analog filter capable, for each cycle of the conversion phase, of receiving an internal analog signal originating from the analog input signal and of supplying an analog output value, wherein: the contribution of the internal analog signal to the output value of the analog filter is smaller at a given cycle of the conversion phase than at a previous cycle of the conversion phase, the contributions to the different cycles being governed by a first predetermined law which is a function of the rank of the cycle in the conversion phase; and the duration of a given cycle of the conversion phase is shorter than the duration of a previous cycle of the conversion phase, the durations of the different cycles being governed by a second predetermined law which is a function of the rank of the cycle in the conversion phase.

According to an embodiment, the second law is decreasing over the entire duration of the conversion phase.

According to an embodiment, the second law is decreasing in stages.

According to an embodiment, the analog filter comprises at least one integration capacitor of adjustable value.

According to an embodiment, during the conversion phase, the value of the integration capacitor varies proportionally to the cycle time.

According to an embodiment, the modulator comprises a plurality of analog filters.

According to an embodiment, the analog filters form a plurality of chains of one or a plurality of cascaded filters, the outputs of said chains being combined to generate an output signal of the modulator.

According to an embodiment, the converter comprises a single 1-bit analog-to-digital converter.

According to an embodiment, the converter comprises at the filter input a device for weighting the internal analog signal received by the analog filter applying a variable weighting coefficient $\beta k$, which is a function of rank k of the cycle and where, during the conversion phase, at least two different coefficients $\beta k-1$ and $\beta k$ are applied, respectively for two successive cycles of rank k−1 and k, and where $\beta k-1 > \beta k$.

According to an embodiment, the variable weighting coefficient $\beta k$ decreases with rank k of the cycle.

According to an embodiment, the analog filter is equivalent to a theoretical circuit comprising an element for summing the value of an analog signal received at cycle k and an internal signal of the filter corresponding to a multiplication by a coefficient $1+\alpha$ of the output signal of the analog filter obtained at cycle k−1, and where, during the conversion phase, at least one value of coefficient α greater than zero is applied for at least one cycle.

According to an embodiment, coefficient α increases with rank k of the cycle.

The foregoing and other features and advantages will be discussed in detail in the following non-limiting description of dedicated embodiments in connection with the accompanying drawings.

DETAILED DESCRIPTION OF THE PRESENT EMBODIMENTS

Figure 1A:
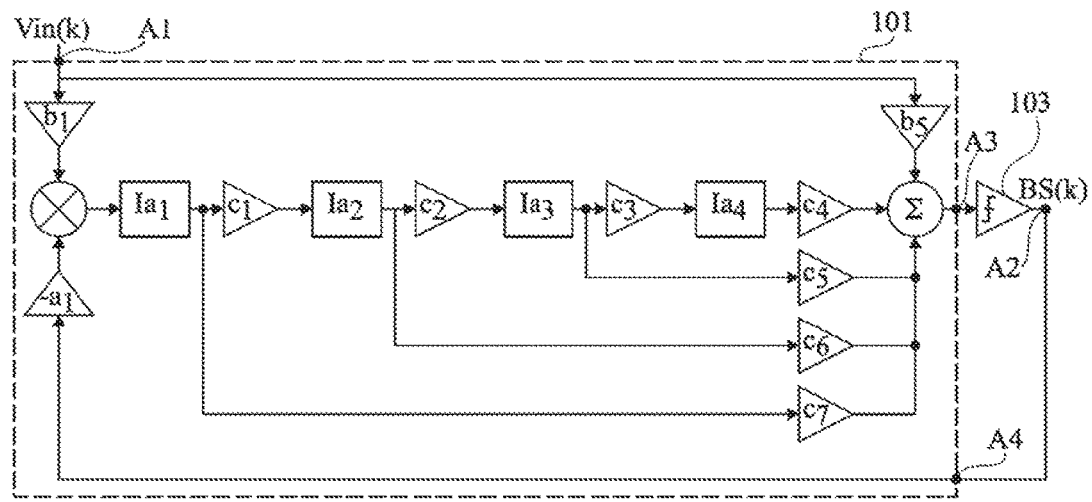
FIGS. 1A and 1B illustrate, in the form of blocks, an example of a sigma-delta converter.

The same elements have been designated with the same reference numerals in the different drawings. For clarity, only those steps and elements which are useful to the understanding of the described embodiments have been shown and are detailed. In particular, the details of the forming of the digital filters of the described sigma-delta converters have not been shown, the forming of such filters being within the abilities of those skilled in the art on reading of the present description.

Figure 1B:
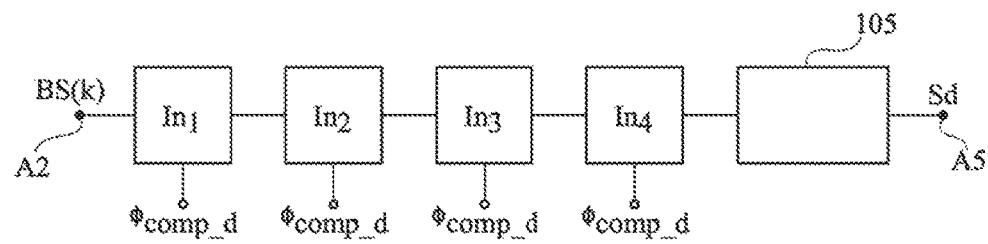

FIGS. 1A and 1B illustrate, in the form of blocks, an example of a sigma-delta converter of order 4. More particularly, FIG. 1A shows the sigma-delta modulator of the converter, and FIG. 1B shows the digital filter of the converter.

The sigma-delta modulator of FIG. 1A comprises an input terminal A1 intended to receive an analog input signal Vin to be digitized, and an output terminal A2 intended to supply a series of binary samples BS representative of signal Vin. For simplification, it is here considered that the analog input signal to be digitized is constant for the entire duration necessary to generate a digital output value over N bits OSR*$T_{OSR}$, $T_{OSR}$ being the converter oversampling period. The described embodiments are however not limited to this specific case and may be adapted to the conversion of variable analog signals.

The modulator of FIG. 1A comprises an analog integration circuit 101 comprising a first input connected to terminal A1 of application of signal Vin, and an output A3 connected to the input of a 1-bit analog-to-digital conversion circuit 103, for example, a 1-bit comparator. The output of converter 103 is connected to output A2 of the modulator, and is further connected by a feedback loop to a second input A4 of integration circuit 101. In the shown example, it is considered that input signal Vin and output signal BS of the modulator are normalized, that is, value 0 of binary signal BS corresponds to a voltage level equal to the smallest value that analog signal Vin can take, and value 1 of signal BS corresponds to a voltage level equal to the largest value that signal Vin can take. Thus, in the shown example, the feedback loop is a simple conductive track connecting terminal A2 to terminal A4, and the feedback signal is directly signal BS. In the case where binary output signal BS is not at the same scale as input signal Vin, the feedback loop may comprise a 1-bit digital-to-analog converter between terminals A2 and A4, the feedback signal then being the output signal of the 1-bit digital-to-analog converter.

For each cycle k of duration $T_{OSR}$ of a phase of conversion of input signal Via into a digital value, k being an integer in the range from 1 to OSR, integration circuit 101 takes an analog sample Vin(k) of the input signal, and the modulator supplies, at the output of 1-bit analog-to-digital converter 103, a binary sample BS(k).

In the example of FIG. 1A, integration circuit 101 comprises four cascaded analog integrators $Ia_1$, $Ia_2$, $Ia_3$, and $Ia_4$, and a summing circuit Σ. Each integrator comprises an input and an output, and for example has a z/(z−1) transfer function, that is, for each cycle, the integrated signal, or output signal of the integrator, is increased by the value of the signal applied to the integrator input.

In the shown example, integrator $Ia_1$ receives on its input a signal equal to the difference between input signal Vin(k)

weighted by a coefficient $b_1$ and feedback signal BS(k−1) weighted by a coefficient $a_1$. Integrator $Ia_2$ receives on its input a signal equal to the output signal of integrator $Ia_1$ weighted by a coefficient $c_1$. Integrator $Ia_3$ receives on its input a signal equal to the output signal of integrator $Ia_2$ weighted by a coefficient $c_2$. Integrator $Ia_4$ receives on its input a signal equal to the output signal of integrator $Ia_3$ weighted by a coefficient $c_3$. The summing circuit adds the input signal Vin(k) weighted by a coefficient $b_5$ and the output signals of integrators $Ia_1$, $Ia_2$, $Ia_3$, and $Ia_4$, respectively weighted by coefficients $c_7$, $c_6$, $c_5$ et $c_4$. The output of summing circuit Σ is connected to output terminal A3 of circuit 101.

Many alternative sigma-delta modulator architectures may be envisaged. Generally, the described embodiments apply to sigma-delta modulators of order p greater than or equal to 1, where each of the p analog integrators $Ia_j$, j being an integer in the range from 1 to p, receives on its input a signal equal to the difference between the input signal Vin(k) weighted by a coefficient $b_j$ and the feedback signal BS(k−1) weighted by a coefficient $a_j$, to which is added, if rank j of integrator $Ia_j$ is greater than 1, the output signal of the modulator $Ia_{j−1}$ of previous rank weighted by a coefficient $c_{j−1}$. Summing circuit Σ adds input signal Vin(k) weighted by a coefficient $b_{p+1}$, the output signal of integrator $Ia_p$ of rank p weighted by a coefficient $c_p$, and, if p is greater than 1, the output signal(s) of the integrators of rank p−1, 1 being an integer in the range from 1 to p−1, respectively weighted by coefficients $c_{p+1}$. Some of the above-mentioned coefficients may be zero. For example, in the modulator of order 4 of FIG. 1, coefficients $b_2$, $b_3$, $b_4$, $a_2$, $a_3$, and $a_4$ are zero. It should be noted that the described embodiments may also apply to modulators further comprising one or a plurality of analog feedbacks from the output of an analog integrator to the input of an upstream analog integrator, through a specific weighting coefficient, and/or where the output of an integrator of rank i is added, through a specific weighting coefficient, to the input of a downstream integrator having a rank greater than or equal to i+2. Further, lags may be introduced between the different stages of circuit 101, and/or between circuit 101 and converter 103.

The digital filter of a sigma-delta converter generally comprises a digital integrator, or a plurality of digital integrators in cascade. Preferably, a sigma-delta modulator of order p is associated with a digital filter comprising a number greater than or equal to p of digital integrators. In the example of FIG. 1B, the digital filter comprises four cascaded digital integrators $In_1$, $In_2$, $In_3$, and $In_4$. Each digital integrator, for example, a counter, comprises an input and an output and, for each cycle, the integrated signal, or output signal of the integrator, is increased by the value of the signal applied to the input of the integrator. First integrator $In_1$ receives on its input the output binary signal BS of the sigma-delta modulator of FIG. 1A, second integrator $In_2$ receives on its input an output digital signal from integrator $In_1$, third integrator $In_3$ receives on its input an output digital signal from integrator $In_2$, and fourth integrator $In_4$ receives on its input an output digital signal from integrator $In_3$. The filter of FIG. 1B carries out a low-pass function intended to extract the useful information from the bit train generated by the sigma-delta modulator. More generally, the digital filter extracts the signal at the frequencies where the attenuation of the NTF is the strongest. Thus, according to the modulator structure, the digital filter may carry out a low-pass function, a bandpass function, or a high-pass function.

The digital integration is performed at the oversampling frequency of the sigma-delta modulator. In the shown example, the four digital integrators $In_j$ are simultaneously controlled by a same control signal $\Phi_{comp\_d}$, of frequency $1/T_{OSR}$. The output of the last digital integrator $In_4$ is connected to a normalization block 105 which has the function of converting the signal supplied by integrator $In_4$ into a digital code over N bits, N being an integer greater than 1 corresponding to the resolution of the sigma-delta converter. As an example, block 105 divides the signal that it receives by a reference value, for example equal to the value that would be taken by the signal for the maximum authorized value of signal Vin, and supplies on an output terminal A5 of the converter an output value $S_d$ representative of the result of the division quantized over N bits.

Various alternative digital filter architectures may be envisaged. In particular, the topology of the digital filter may be modified to approach that of the sigma-delta modulator. For example, instead of receiving on its input only the output signal of the last digital integrator $In_4$, as in the example of FIG. 1B, normalization circuit 105 may receive a signal equal to the sum of the output signals of the four integrators $In_1$, $In_2$, $In_3$, and $In_4$. Further, to still further approach the topology of the sigma-delta modulator, the internal digital signals of the digital filter may be weighted by coefficients identical to those of the modulator.

Figure 2:
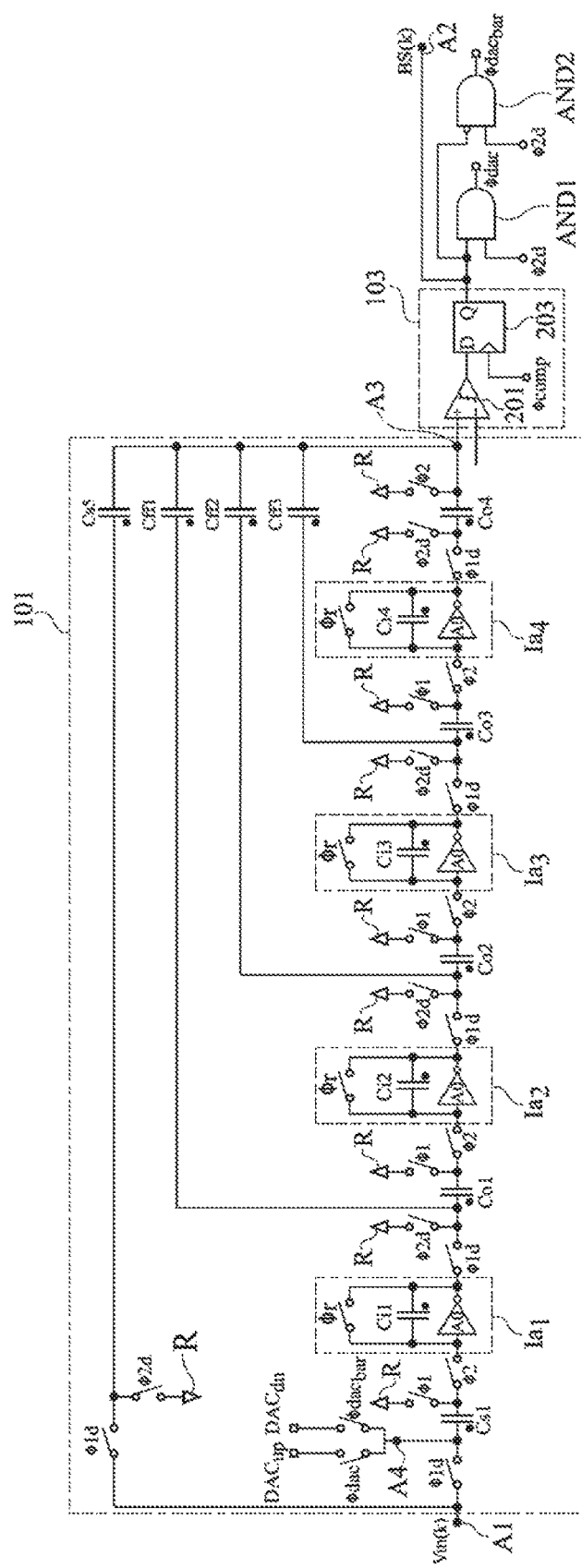
FIG. 2 is a detailed electric diagram of an embodiment of the sigma-delta modulator of FIG. 1A.

FIG. 2 is a detailed electric diagram illustrating a (non-limiting) embodiment of the sigma-delta modulator of FIG. 1A.

In the example of FIG. 2, each integrator $Ia_j$ comprises an operational amplifier AO having its input connected to the output by an integration capacitor Cij. The input and the output of the operational amplifier respectively form the input and the output of the integrator. Each integrator $Ia_j$ further comprises, in parallel with its integration capacitance Cij, a reset switch controlled by a signal Φr. In the following description, for simplification, the switches of the modulator are designated with the same reference numerals as their respective control signals.

The outputs of integrators $Ia_1$, $Ia_2$, $Ia_3$, and $Ia_4$ are respectively connected to a first electrode of a capacitor Co1, to a first electrode of a capacitor Co2, to a first electrode of a capacitor Co3, and to a first electrode of a capacitor Co4, by first, second, third, and fourth switches Φ1d. Further, the first electrodes of capacitors Co1, Co2, Co3, and Co4 are connected to a node R of application of a reference potential, for example equal to the average potential between high output value $DAC_{up}$ and low output value $DAC_{dn}$ of the feedback digital-to-analog converter, respectively by first, second, third, and fourth switches Φ2d. The second electrodes of capacitors Co1, Co2, and Co3 are connected to node R respectively by first, second, and third switches Φ1. Further, the second electrodes of capacitors Co1, Co2, and Co3 are respectively connected to the input of integrator $Ia_2$, to the input of integrator $Ia_3$, and to the input of integrator $Ia_4$, by first, second, and third switches Φ2. The second electrode of capacitor Co4 is connected to node R by a fourth switch Φ2, and is further connected to input A3 of analog-to-digital converter 103.

The modulator of FIG. 2 further comprises a capacitor Cs1 having a first electrode connected to terminal A1 of application of input signal Vin by a fifth switch Φ1d, and having its second electrode connected to the input of integrator $Ia_1$ by a fifth switch Φ2. The second electrode of capacitor Cs1 is further connected to node R by a fourth switch Φ1. Further, the first electrode of capacitor Cs1 is connected to a node of application of a potential DACup by a switch Φdac, and to a node of application of a potential DACdn smaller than potential DACup by a switch $\Phi dac_{bar}$.

Terminal A1 of application of input signal Vin is further connected to a first electrode of a capacitor Cs5 by a sixth switch Φ1d. The first electrode of capacitor Cs5 is further connected to node R by a fifth switch Φ2d. The second electrode of capacitor Cs5 is connected to input node A3 of analog-to-digital converter 103.

Further, the first electrodes of capacitors Co1, Co2, and Co3 are connected to the input node of analog-to-digital converter 103 respectively by capacitors Cff1, Cff2, and Cff3.

In this example, 1-bit analog-to-digital converter 103 comprises a comparator 201 and a flip-flop 203. The input of comparator 201 forms the input of converter 103. The output of comparator 201 is connected to the input of flip-flop 203. The output of flip-flop 203 forms output A2 of converter 103, supplying output signal BS of the sigma-delta modulator. In operation, the output of comparator 201 switches from a high state to a low state according to whether the signal applied to terminal A3 is greater than or smaller than a threshold, for example, equal to the reference potential applied to node R. Flip-flop 203 samples the output signal of comparator 201 and copies it on the modulator output for each rising or falling edge of a control signal Φcomp.

The modulator of FIG. 2 further comprises two AND gates AND1 and AND2, each comprising two binary inputs and one binary output. The inputs of gate AND1 are respectively connected to output A2 of converter 103 and to control signal Φ2d, and the inputs of gate AND2 respectively receive a signal complementary to the output signal of converter 103 and control signal Φ2d. The output of gate AND1 is connected to a control node of switch Φdac, and the output of gate AND2 is connected to a control node of switch $\Phi dac_{bar}$.

Integrators $Ia_1$, $Ia_2$, $Ia_3$, and $Ia_4$, capacitors Cs1, Co1, Co2, Co3, Co4, Cs5, Cff1, Cff2, and Cff3, and switches Φ1, Φ2, Φ1d, and Φ2d form analog integration circuit 101 of the modulator. Switches Φdac and $\Phi dac_{bar}$ and gates AND1 and AND2 form the 1-bit digital-to-analog converter of the feedback loop of the modulator.

Figure 3:
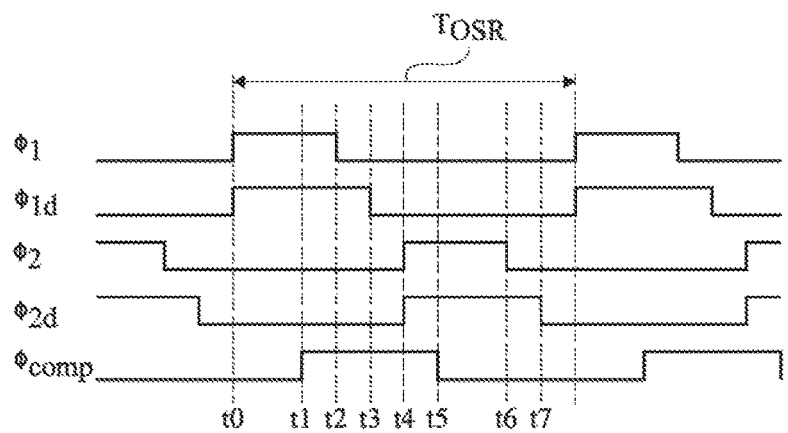
FIG. 3 is a timing diagram illustrating the time variation of control signals of the modulator of FIG. 2.

FIG. 3 is a timing diagram illustrating the variation over time of control signals Φ1, Φ1d, Φ2, Φ2d, and Φcomp of the modulator of FIG. 2 according to an example of a method of controlling this modulator. More particularly, FIG. 3 illustrates the variation of signals Φ1, Φ1d, Φ2, Φ2d, and Φcomp during a cycle $T_{OSR}$ corresponding to a modulator oversampling period. As an example, the acquisition of a digital value over N bits representative of input signal Vin may comprise an initial phase of resetting analog integrators $Ia_1$, $Ia_2$, $Ia_3$, and $Ia_4$, during which switches Φr are turned on to discharge integration capacitors Ci1, Ci2, Ci3, and Ci4. At the end of the reset phase, switches Φr may be turned off, after which the control sequence of duration $T_{OSR}$ illustrated in FIG. 3 may be repeated OSR times (in the case of an incremental sigma-delta converter reset between two successive analog-to-digital conversions, or more than OSR times if it is not an incremental converter).

At a time t0 of beginning of a modulator control cycle $T_{OSR}$, switches Φ1 and Φ1d are controlled to the on state (control signals corresponding to state 1 in this example), and switches Φ2 and Φ2d are controlled to the off state (control signals corresponding to state 0 in this example). This leads to the sampling of input signal Vin on input capacitor Cs1 of integrator $Ia_1$, and of the output signals of integrators $Ia_1$, $Ia_2$, $Ia_3$ respectively on input capacitors Co1, Co2, and Co3 of integrators $Ia_1$, $Ia_2$, and $Ia_3$. The sampled signals being voltages, each capacitor stores a quantity of charges proportional to the product of the sampled voltage by the value of the sampling capacitance. During this phase, the signals stored in capacitors Cs5, Cff1, Cff2, Cff3, and Co4 are summed on output node A3 of circuit 101, which forms summing element Σ of FIG. 1A. The weighted sum of the signals stored in these capacitors is thus achieved, the applied weighting resulting from the values of the capacitances.

At a time t1 subsequent to time t0 , signal Φcomp is set to the high state. The input signal of analog-to-digital converter 103 (voltage of node A3) is quantized over one bit by converter 103 on the rising edge of signal Φcomp. The binary value of output signal BS is thus updated.

At a time t2 subsequent to time t1, signal Φ1 is set to the low state and, at a time t3 subsequent to time t2 , signal Φ1d is set to the low state.

At a time t4 subsequent to time t3, signals Φ2 and Φ2d are set to the high state. As a result, the values of integrators $Ia_1$, $Ia_2$, $Ia_3$, and $Ia_4$ are updated, that is, the charges sampled in capacitors Cs1, Co1, Co2, Co3 are integrated in capacitors Ci1, Ci2, Ci3, Ci4, respectively. Further, the feedback is activated, that is, signal DACup or DACdn (according to whether signal BS is in the high or low state) is subtracted from the input signal of capacitor Cs1.

At a time t5, subsequent to time t4 in the present example, signal Φcomp is set back to the low state.

At a time t6 subsequent to time t6, signal Φ2 is set to the low state and, at a time t7 subsequent to time t6 , signal Φ2d is set to the low state.

After time t7, the above-mentioned cycle may start again.

The quantization is performed during phase Φ1=1, and the integration of the new feedback is performed during phase Φ2=1.

The digital binary output value BS(k) of the modulator obtained for each cycle $T_{OSR}$ is integrated by the digital filter at the modulator oversampling frequency, for example, on rising edges of signal $\Phi_{comp\_d}$, which may be a delayed copy of signal $\Phi_{comp}$ (with a lag shorter than $T_{OSR}$).

The values of capacitances Cs1, Cs5, Co1, Co2, Co3, Co4, Cff1, Cff2, Cff3 set the values of coefficients $b_1$, $b_5$, $a_1$, $c_1$, $c_2$, $c_3$, $c_4$, $c_5$, $c_6$, $c_7$ of the modulator, for example, according to the following relations: $Ci1=2*Cs1/c_1$; $Ci2=Co1/c_2$; $Ci3=Co2/c_3$; $Ci4=Co3/c_4$; $Cff1=Cs5*(c_7/(c_1*b_5))$; $Cff2=Cs5*(c_6/(c_2*b_5))$; $Cff3=Cs5*(c_5/(c_3*b_5))$; and $Co4=Cs5/b_5$.

An important feature of a sigma-delta converter is its linearity. The non-linearity error, generally designated with acronym INL ("Integral Non Linearity") in the art, is the maximum difference (peak-to-peak error), on the converter operating range, between the transfer function of the converter (which matches each value of the analog input signal with a digital output code), and the ideal linear transfer function. The linearity error may be expressed in LSB ("Least Significant Bit"), where $1 LSB = (Vin_{max} - Vin_{min})/2^N$, $Vin_{max}$ and $Vin_{min}$ being respectively the maximum value and the minimum value of the input analog signal on the converter operating range, and N being the converter quantization resolution. Linearity L of the converter may be defined by the following formula: $L = \log_2((Vin_{max} - Vin_{min})/(INL*LSB))$.

Another important feature of a sigma-delta converter is its output noise B, which can be defined as being the average, over the $[Vin_{min}, Vin_{max}]$ operating range of the converter (over a significant number of conversions for each point of the input dynamics), of the standard deviations of the digital output codes of the converter of each level of the analog input signal.

Figure 4:
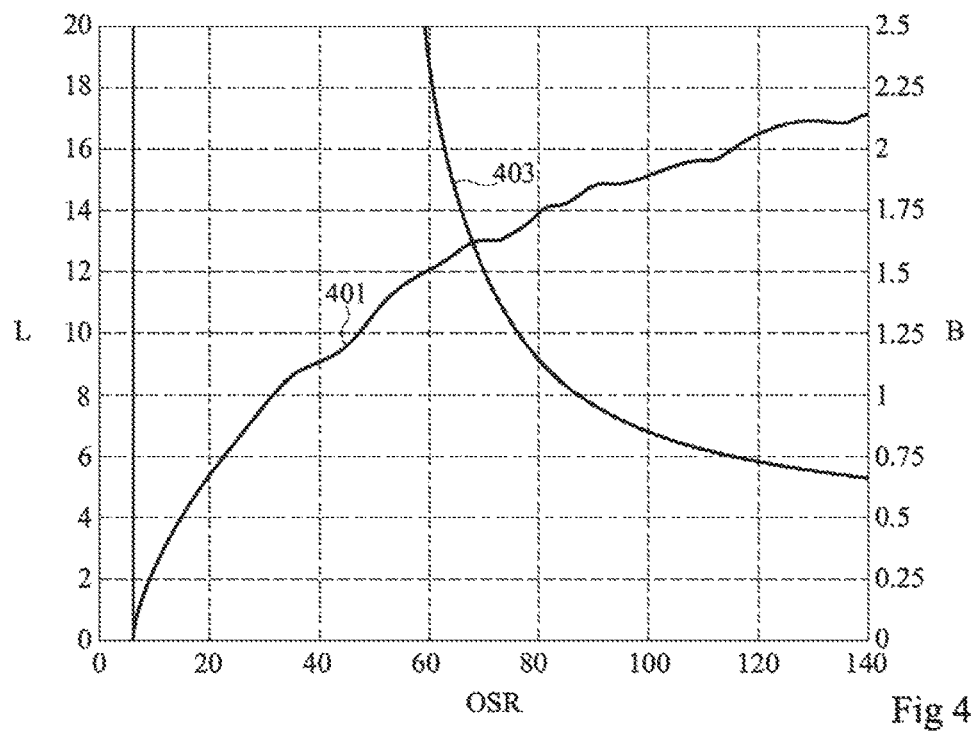
FIG. 4 is a diagram illustrating the variation of the linearity and of the noise, according to the OSR, in a sigma-delta converter of the type described in relation with FIGS. 1 to 3.

FIG. 4 is a diagram illustrating the variation of linearity L and of noise B, according to the OSR, in a sigma-delta converter of the type described in relation with FIGS. 1 to 3. More particularly, curve 401 shows the variation of linearity L (in ordinates on the left-hand side) according to the OSR (in abscissas), and curve 403 shows the variation of noise B expressed in LSB (in ordinates on the right-hand side) according to the OSR. In this example, a sigma-delta converter performing a quantization over N=16 bits has been considered.

As appears in FIG. 4, the more the OSR increases, the more linearity L increases, and the more noise B decreases. As an example, an OSR equal to 100 enables to have a linearity value L equal to 15 and a noise level B equal to 0.85 LSB, while an OSR equal to 60 only provides a linearity L equal to 12 and a noise level B equal to 2.4 LSB.

It would be desirable to be able to improve the linearity of a sigma-delta converter for a given OSR or, for a given linearity value, to be able to decrease the OSR, and this without significantly degrading the converter output noise.

The provided solution, which will now be described, is particularly advantageous for sigma-delta converters having an order greater than 1, where it enables to significantly improve the OSR-vs.-linearity tradeoff. However, such a solution is compatible with sigma-delta converters of order 1, where it also enables to improve the OSR-vs.-linearity tradeoff (and further to increase the signal-to-noise ratio induced by the quantization noise, for example, generally defined by $\log_2(((3*OSR^3)/(\pi^2/12))^{1/2})$ in a modulator of order 1 with no variable coefficient.

According to an aspect of an embodiment, a sigma-delta converter where, during the acquisition of a digital value over N bits representative of the analog input signal, at least one weighting coefficient of the sigma-delta converter varies dynamically according to a predetermined law f, is provided. Preferably, at least one digital signal internal to the digital filter is further weighted by a predetermined variable law, for example, but not necessarily, by the same law f as that applied in the modulator.

This is a difference with respect to known sigma-delta converters, where the weighting coefficients of the modulator are fixed, and in particular remain constant during the OSR sampling cycles of a phase of analog-to-digital conversion of the input signal. Further, in known sigma-delta converters, no signal internal to the digital filter is weighted by a dynamically variable coefficient during the OSR sampling cycles of a phase of analog-to-digital conversion of the input signal.

It should be noted that the weighting coefficient of the modulator having law f applied thereto may for example have an initial value (before modulation by law f) equal to 1 (as an example, a connection wire with no apparent coefficient corresponds to a unit coefficient, and it may be chosen to apply law f to this coefficient). The described embodiments are however not limited to this specific case.

Figure 5A:
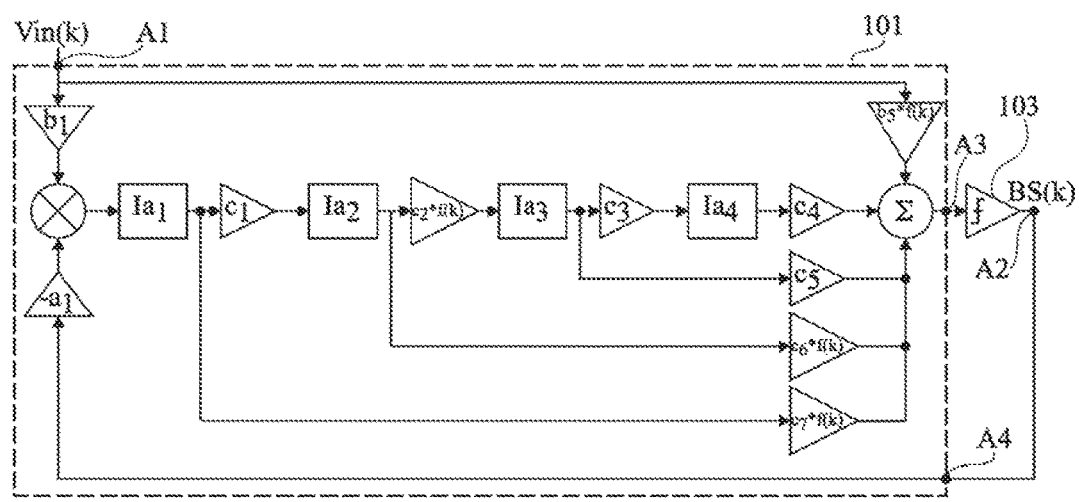
FIGS. 5A and 5B illustrate, in the form of blocks, another embodiment of a sigma-delta converter.
Figure 5B:
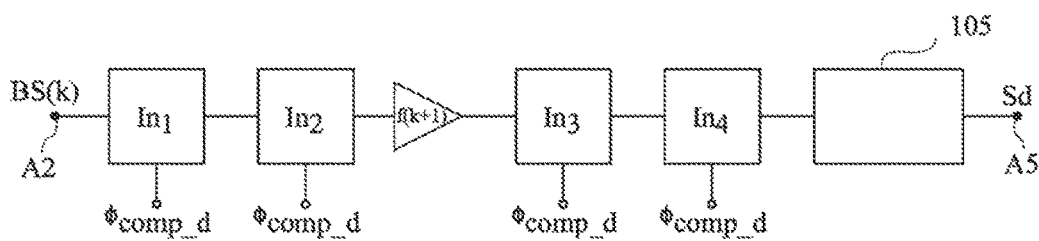

FIGS. 5A and 5B illustrate in the form of blocks an embodiment of a sigma-delta converter. In the shown example, the converter is a converter of order 4. FIG. 5A shows the sigma-delta modulator of the converter, and FIG. 5B shows the digital filter of the converter.

The sigma-delta converter of FIGS. 5A and 5B has elements common with the sigma-delta converter of FIGS. 1A and 1B. These elements will not be detailed again. Only the differences between the two converters will be discussed hereafter.

The sigma-delta modulator of FIG. 5A differs from the sigma-delta modulator of FIG. 1A essentially in that, in the modulator of FIG. 5A, weighting coefficients $c_2$, $c_6$, $c_7$, and $b_5$ are modulated by a same predetermined variable law f. For each sampling cycle k of a phase of analog-to-digital conversion of the input signal, k being an integer in the range from 1 to OSR, value f(k) of law f is capable of taking a new value. Thus, fixed weighting coefficients $c_2$, $c_6$, $c_7$, and $b_5$ of the modulator of FIG. 1A are replaced with variable coefficients $c_2*f(k)$, $c_6*f(k)$, $c_7*f(k)$, and $b_5*f(k)$. Law f(k) is preferably non binary. The OSR values f(k) of law f are for example stored in a memory of a control circuit (not shown) of the sigma-delta converter. An example of a circuit enabling to apply a variable weighting law to coefficients of the modulator will be described in further detail hereafter in relation with FIG. 12. The basic values (not modulated by law f) of coefficients $c_2$, $c_6$, $c_7$, and $b_5$, as well as the values of fixed coefficients $b_1$, $a_1$, $c_1$, $c_3$, $c_4$, and $c_5$, may be determined by usual methods of determining the coefficients of a sigma-delta modulator, for example, according to the sizing rules described in the article entitled "Automatic coefficients design for high-order sigma-delta modulators" of Kuo, T. H., Chen, K. D., and Chen, J. R. (Circuits and Systems II: Analog and Digital Signal Processing, IEEE Transactions, Volume 46, Issue 1), or in document "Understanding Delta-Sigma Data Converters" (John Wiley & Sons, New York, 2004).

The digital filter of FIG. 5B differs from the digital filter of FIG. 1B essentially in that, in the filter of FIG. 5B, the variable weighting law f applied to coefficients $c_2$, $c_6$, $c_7$, and $b_5$ of the sigma-delta modulator is further applied to the digital input signal of the digital integrator of rank 3 In$_3$. In the shown example, variable law f is applied at the digital filter one cycle ahead of the modulator, that is, during a sampling cycle $T_{OSR}$ of the sigma-delta converter, if weighting value f(k) is applied to coefficients $c_2$, $c_6$, $c_7$, and $b_5$ of the modulator, weighting value f(k+1) is applied to the input signal of digital integrator In$_3$. The inventors have indeed observed that such a shifting by one cycle provides a particularly good performance in terms of linearity. The described embodiments are however not limited to this specific case. As a variation, law f may be applied in phase at the modulator and at the digital filter, or with an advance greater than one cycle in the digital filter, or with a lag by one cycle or more in the digital filter. In another alternative embodiment, law f may be applied with a phase shift of one cycle or more on different coefficients of the modulator, or on different signals of the digital filter. For example, during a same cycle k of a phase of analog-to-digital conversion of the input signal, coefficient a1 of the modulator may be weighted with value f(k), and coefficient b1 may be weighted with value f(k+1).

The described embodiments are not limited to the specific example of FIGS. 5A and 5B, where the sigma-delta converter is a converter of order 4 and where weighting law f(k) is applied to coefficients $c_2$, $c_6$, $c_7$, and $b_5$ of the modulator, and at the input of the digital integrator of rank 3 of the digital filter.

More generally, whatever the order of the converter, the selection of the coefficients of the modulator having weighting law f(k) applied thereto is preferably such that at least one input coefficient of an analog integrator Ia$_j$ of the modulator is modulated by law f. Further, in a preferred embodiment, at least one input coefficient of a digital integrator In$_k$ of the digital filter is modulated by law f, with preferably j=k.

Preferably, it is further provided that the analog signals added or subtracted in the modulator are at the same scale regarding law f(k), that is, they have been multiplied or divided a same number of times (possibly zero) by law f(k). In other words, a rescaling enables the analog signals to vary within a same amplitude range for a given amplitude range of the analog input signal (Vin). The selection of the coefficients of the modulator having weighting law f(k) applied thereto may for example be performed so that all the samples forming the integrated output signal of analog integration signal 101 are at the same scale regarding law f(k). Preferably, it is provided that at least one input coefficient of an analog integrator $Ia_i$ is modulated by law f, and that all the signals added or subtracted to the weighted signal, be it at the input of integrator $Ia_i$ or on the downstream path (after the output of integrator $Ia_i$), are preferably at the same scale regarding law f. A signal is considered to be scaled regarding law f if it is located on the downstream path of an integrator having an upstream coefficient weighted by law f, or if it is itself directly weighted by law f.

As an example, the selection of the modulator coefficients having weighting law f(k) applied thereto is performed so that all the samples forming the integrated output signal of circuit 101 are multiplied (directly or indirectly if the sample is an output sample of an integrator having a downstream coefficient weighted by law f) by law f(k). This rule is particularly respected in the modulator of FIG. 5A, where all the samples forming the input signals of summing element Σ are directly or indirectly multiplied by law f(k) (directly for signals passing through variable coefficients $b_5*f(k)$, $c_6*f(k)$, and $c_7*f(k)$, and indirectly for signals passing through fixed coefficients $c_4$ and $c_5$, since these signals have passed upstream through variable coefficient $c_2*f(k)$). As a variation, and respecting this same rule, the coefficients of the modulator having law f(k) applied thereto may be coefficients $b_1$, $a_1$, and $b_5$, or in another variation coefficients $c_1$, $b_5$, and $c_7$, or in another variation coefficients $c_3$, $b_5$, $c_5$, $c_6$, and $c_7$. The weighting of the set of coefficients c4, c5, c6, c7, and c5 by law f is less advantageous since no upstream coefficient of an analog integrator is modulated by law f.

At the digital filter, weighting law f(k) may be applied to a signal other than the input signal of the digital integrator of rank 3 $In_3$. More generally and in the same way as in the modulator, the selection of the digital signals having law f(k) applied thereto is preferably performed so that weighting law f(k) is applied to the input of at least one digital integrator, preferably the integrator of same rank j as the analog integrator $Ia_j$ having law f(k) applied at the input thereof in the modulator. Further, as in the modulator, the selection of the digital signals having law f(k) applied thereto is preferably performed so that the digital signals added or subtracted in the digital filter are at the same scale regarding law f(k). Preferably, the digital filter comprises a number of cascaded digital integrators greater than or equal (preferably equal) to order p of the sigma-delta modulator. Further, if the digital filter has a topology similar to that of the modulator, law f(k) may be applied substantially at the same points in the modulator and in the digital filter.

As a variation, to respect the scaling of the intermediate signals combined to form the output signal of analog integration circuit 101 of the modulator, certain intermediate signals may be multiplied by law f(k), and others divided by law f(k). For example, coefficient $c_2$ may be multiplied by law f(k) and coefficients $c_4$ and $c_5$ may be divided by law f(k) to keep a same scale at the summing element, the other coefficients of the modulator remaining constant. In this case, the weighting by law f(k) at the digital filter may be identical to what has been previously described (multiplication of the input signal of integrator $In_3$ by law f(k)).

The inventors have observed that whatever the selected law f, and provided for law f to have at least one decrease phase over the range of indexes k ranging from 1 to OSR, the fact of applying a variable weighting coefficient to at least one internal analog signal of the sigma-delta modulator and advantageously to at least one internal digital signal of the digital filter enables to significantly improve the linearity of the sigma-delta converter (for a given OSR). The decrease phase is a function of rank k of the cycle. The decrease phase generates a contribution to the analog filter of the internal analog signal at a given cycle k which is lower than the contribution to the analog filter of the same internal analog signal at the previous cycle k−1. At least one decreasing contribution between two cycles of successive ranks already provides an advantage. As an example, law f may be a decreasing law over the entire range of indexes k from 1 to OSR, for example, a decreasing exponential law. As a variation, law f may be a constant law, for example, equal to 1, over the range of indexes k from 1 to t, t being an integer in the range from 1 to OSR, and decreasing (for example, according to an exponential) over the range of indexes k from t+1 to OSR.

Figure 6:
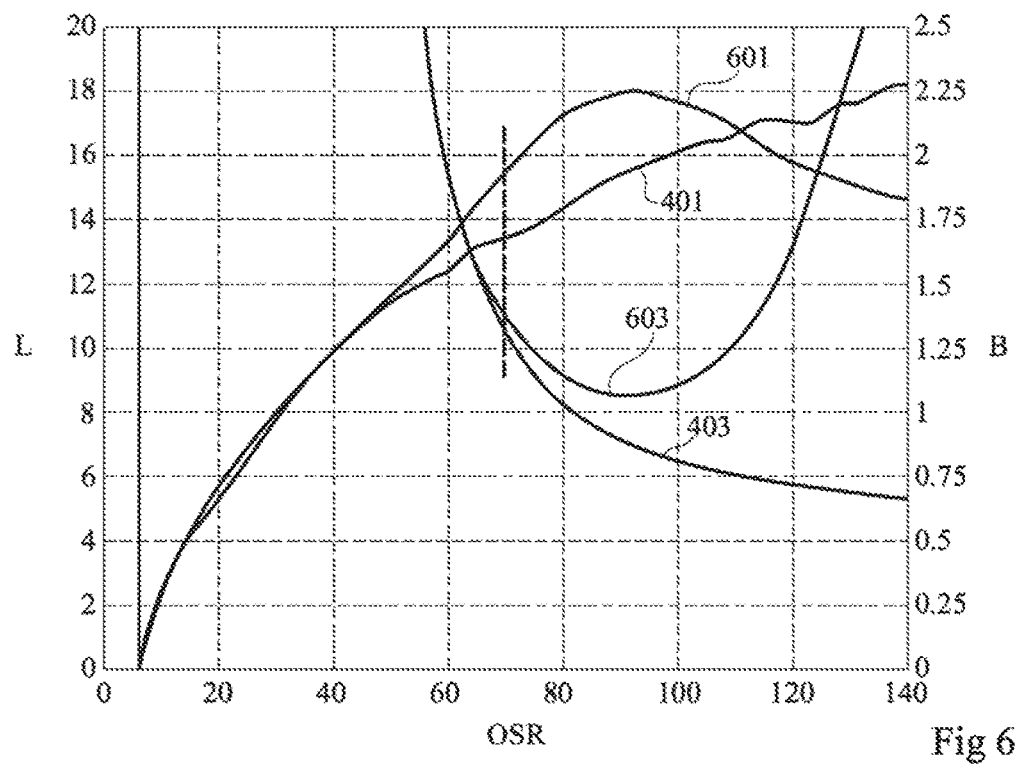
FIG. 6 is a diagram illustrating the variation of the linearity and of the noise, according to the OSR, in a sigma-delta converter of the type described in relation with FIGS. 5A and 5B.
Figure 7:
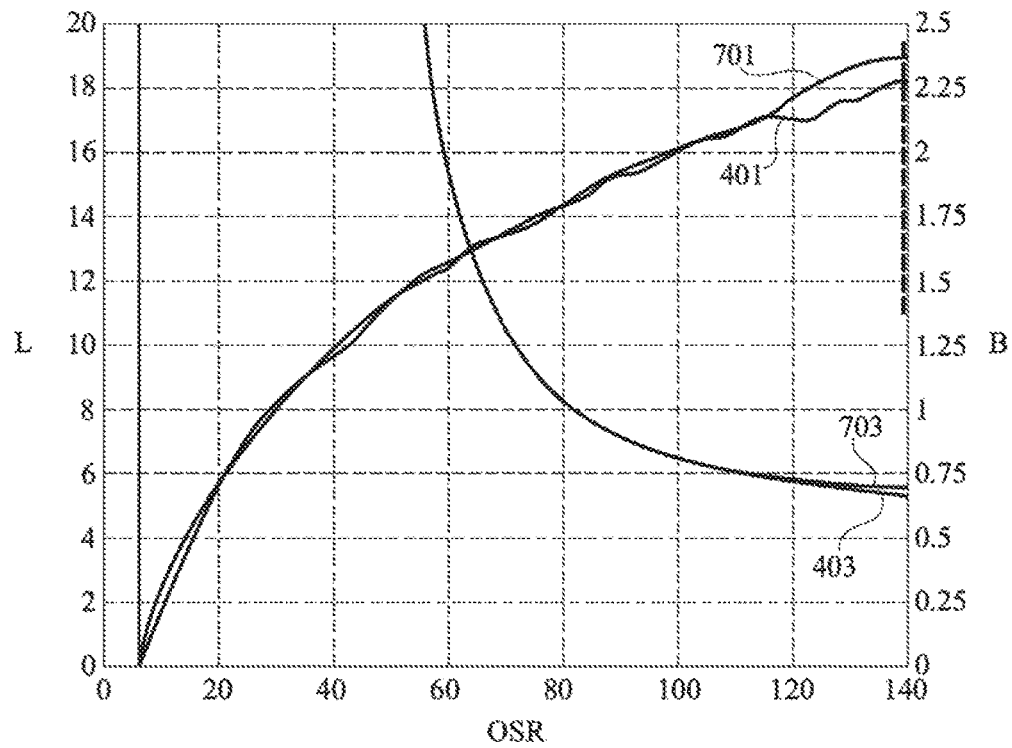
FIG. 7 is a diagram illustrating the variation of the linearity and of the noise, according to the OSR, in another example of a sigma-delta converter of the type described in relation with FIGS. 5A and 5B.
Figure 8:
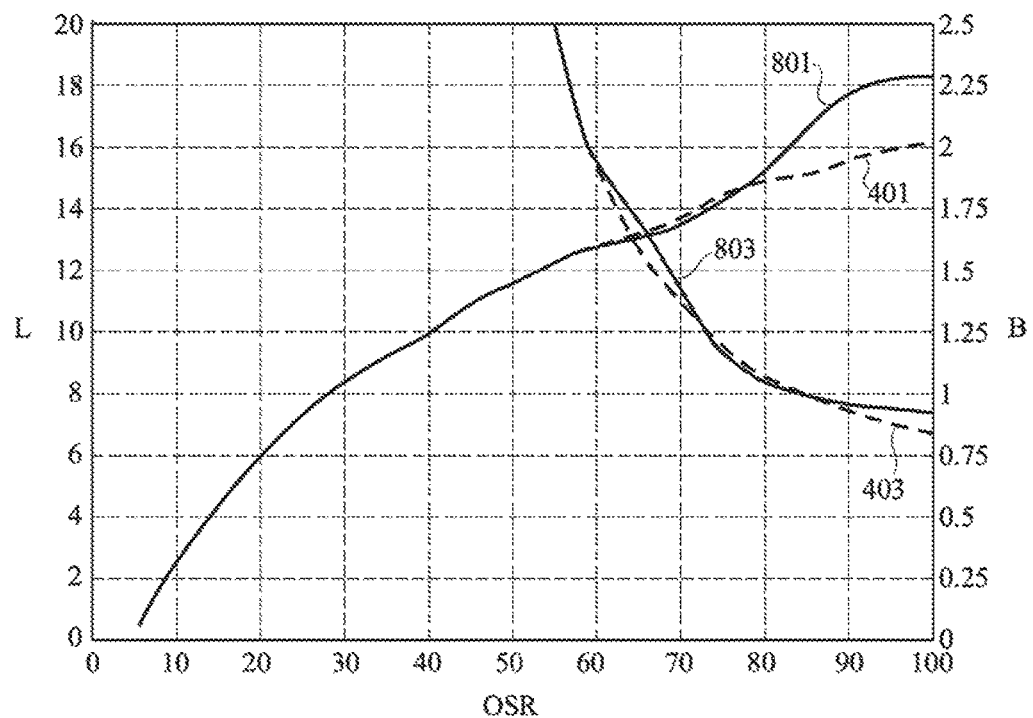
FIG. 8 is a diagram illustrating the variation of the linearity and of the noise, according to the OSR, in another example of a sigma-delta converter of the type described in relation with FIGS. 5A and 5B.

FIGS. 6, 7, and 8 are diagrams illustrating, for three different laws f, the variation of linearity L and of noise B according to the OSR in a sigma-delta converter of the type described in relation with FIGS. 5A and 5B.

In the example of FIG. 6, the dynamic weighting law applied to the sigma-delta converter is given by equation $f(k)=e^{-k/25}$.

In the example of FIG. 7, the dynamic weighting law applied to the sigma-delta converter is defined as follows:
for k<100, f(k)=1; and
for k>=100, $f(k)=e^{-(k-100)/20}$.

In the example of FIG. 8, the dynamic weighting law applied to the sigma-delta converter is defined as follows:
for k<60, f(k)=1;
for 60<=k<75, $f(k)=e^{-(k-40)/20}$; and
for k>=75, $f(k)=e^{-(75-40)/20}$.

In FIGS. 6, 7, and 8, curves 601, respectively 701, respectively 801 show the variation of linearity L (in ordinates on the left-hand side) according to the OSR (in abscissas), and curves 603, respectively 703, respectively 803, show the variation of noise B expressed in LSB (in ordinates on the right-hand side) according to the OSR. In this example, a sigma-delta converter performing a quantization over N=16 bits has been considered. Linearity and noise curves 401 and 403 of FIG. 4, which correspond to the same sigma-delta converter but where no dynamic weighting of the signals is performed, have also be plotted in FIGS. 6, 7, and 8 for comparison purposes.

In FIG. 6, it can be observed that for an OSR equal to 70, the noise is substantially unchanged with respect to the example of FIG. 4, but that the linearity is greatly improved, since it passes from a value approximately equal to 13.5 to a value approximately equal to 15.5. For higher OSRs, it can be observed that the linearity keeps on improving with respect to the example of FIG. 4, but that the noise significantly increases. Such a noise increase for high OSRs may in particular be explained by the significant attenuation of the samples of high index k by law f(k).

In FIG. 7, it can be observed that for an OSR equal to 140, the linearity is increased by approximately 0.8 with respect to the example of FIG. 4, and that the noise remains substantially at the same level as in the example of FIG. 4, that is, approximately 0.70 LSB.

In FIG. 8, it can be observed that for an OSR equal to 100, the linearity is increased by approximately 2 with respect to the example of FIG. 4, and that the noise remains substantially at the same level as in the example of FIG. 4.

Generally, it can be observed that laws of the type used in the example of FIG. 7, that is, comprising a constant unit phase at the beginning of the analog-to-digital conversion phase of the input signal, followed by a decreasing phase, for example, exponential, at the end of the conversion phase, or laws of the type used in the example of FIG. 8, that is, comprising a constant unit phase at the beginning of the analog-to-digital conversion phase, followed by a decreasing phase, for example, exponential, at an intermediate stage of the conversion phase, and then with a constant low-level phase at the end of the conversion phase, provide a good tradeoff in terms of noise and of linearity.

Of course, the ranges of values OSR of interest, that is, where a linearity gain can be observed, without for the noise to be significantly degraded, depend on many parameters and particularly on the order of the modulator.

It should further be noted that the linearity gain may differ according to the location in the modulator where the weighting by law f(k) is applied. In particular, the more upstream the weighting is applied in the modulator, the higher the linearity gain, but the more significant the output noise increase if a modulator having each block submitted to a temporal noise is considered.

To help selecting a weighting law f(k) adapted to the targeted application, the following considerations may be taken into account.

Saturation:

The initial (non-weighted) values of the modulator coefficients may be determined by usual methods of determining the coefficients of a sigma-delta modulator. Generally, to maximize the signal-to-noise ratio, the values of the coefficients are selected to maximize the signals internal to the modulator, while however ascertaining not to exceed the modulator saturation threshold. The use of a law f having weighting values f(k) greater than 1 then risks resulting in the modulator saturation. A law f having all its values smaller than or equal to 1 will be preferred in this case. If, however, the modulator coefficients are selected so that the internal signals of the modulator always remain distant from the saturation threshold, law f may have values greater than 1, which particularly enables to increase the signal-to-noise ratio.

Variation of Law f:

Generally, law f may have constant variation phases and/or increasing variation phases to satisfy the various constraints of the sigma-delta converter, particularly in terms of noise and/or of continuity or of periodicity (cyclic law) of law f if the analog or digital integrators are not reset between two successive phases of acquisition of a digital value of the signal (for example, in the case of a sigma-delta converter used to digitize variable signals). To obtain the desired linearity gain, law f however comprises a decreasing variation phase during a phase of acquisition of a digital value of the input signal.

It should further be noted that predetermined law means that the law is defined on design of the modulator or during a phase of configuration thereof. However, the law may optionally be dynamically adjusted according to predefined rules, during a phase of acquisition of a digital value of the input signal, for example, to adapt the law to the characteristics of the signal being converted.

As a variation, a plurality of different predetermined laws may be used to weight the coefficients of the sigma-delta modulator. As an example, coefficient $c_1$ may be multiplied by a first variable law f1(k), and coefficient $c_2$ may be multiplied by a second variable law f2(k) different from law f1. In this case, to respect the above-mentioned rules of scaling of the different modulator signals, coefficient $c_6$ is multiplied by law f2, coefficient $c_7$ is multiplied by law f1 and by law f2, and coefficient $b_5$ is multiplied by law f1 and by law f2. At the digital filter, the input signal of the digital integrator of rank 2 $In_2$ may be multiplied by law f1, and the input signal of the digital integrator of rank 3 $In_3$ is multiplied by law f2.

In another example, coefficient $c_2$ may be multiplied by a first variable law f1(k). In this case, to respect the scaling of the different signals of the modulator, coefficients $c_6$ and $c_7$ are multiplied by law f1(k). A second law f2(k) is applied to feedback coefficient a1. Coefficient b5 is weighted by f1(k)*f2(k). Finally, a third law f3(k) is applied to coefficient b1 of input signal Vin. At the digital filter, the input signal of the digital integrator of rank 1 $In_1$ may be multiplied by feedback weighting law f2(k+1) and the input signal of the digital integrator of rank 3 $In_3$ may be multiplied by law f1(k+1). It should be noted that the scaling rules in this example are not applied at any point, particularly between coefficients b1 and a1, respectively modulated by two different laws f2 and f3. Similarly, law f3 is here not applied to the digital filter. The weighting law for the input signal of the filter differs in this example from that of the modulator. Certain weightings may thus be applied only on one of the modulator coefficients, upstream of an integrator, with no downstream scaling and without being applied to the filter. In the previously-mentioned example, law f3 may be different from zero over the first j cycles, and then set to 0 from a cycle k (with 1<j<k<OSR). Thus, the quantization process may carry on with a zero weighting of the input signal, without for this to decrease the linearity gain. Indeed, the provided weighting process enables to carry on the quantization of the residue of the conversion of input signal Vin, after having weighted Vin with a non-zero weight over j first cycles.

Such combinations of laws may in particular enable to relax the implementation constraints which might result from the use of a single weighting law at the input of a single analog integrator of the modulator and of a signal digital integrator of the digital filter.

The embodiments described in relation with FIGS. 5A, 5B, 6, 7, and 8 may be adapted to all known architectures of sigma-delta converters of order p greater than or equal to 1.

Figure 9:
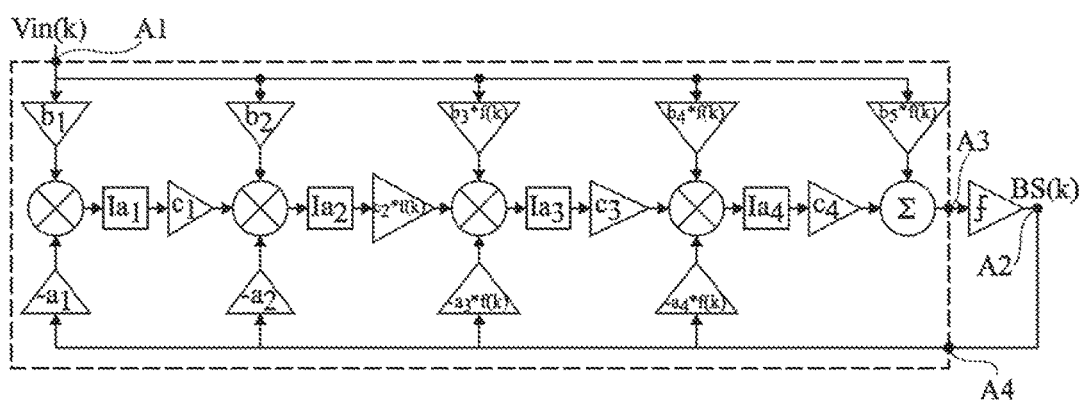
FIG. 9 illustrates, in the form of blocks, another embodiment of a sigma-delta converter.

FIG. 9 illustrates an example of application to another type of sigma-delta converter architecture. In FIG. 9, only the sigma-delta modulator of the converter has been shown. The digital filter of the converter is for example identical or similar to the digital filter of FIG. 5B.

The sigma-delta modulator of FIG. 9 comprises elements common with the sigma-delta modulator of FIG. 5A. Hereafter, only the differences between the two modulators will be detailed. The modulator of FIG. 9 differs from the modulator of FIG. 5A particularly in that, in the modulator of FIG. 9, weighting coefficients $b_2$, $a_2$, $b_3$, $a_3$, $b_4$, and $a_4$ are non-zero and coefficients $c_5$, $c_6$, and $c_7$ are zero.

In the example of FIG. 9, weighting coefficients $c_2$, $b_3$, $a_3$, $b_4$, $a_4$, and $b_5$ are multiplied by a same predetermine variable law f.

As in the example of FIGS. 5A and 5B, a significant gain in terms of linearity and a substantially preserved noise level as compared with the case where all the modulator coefficients would be constant can be observed in certain OSR ranges.

Figure 10:
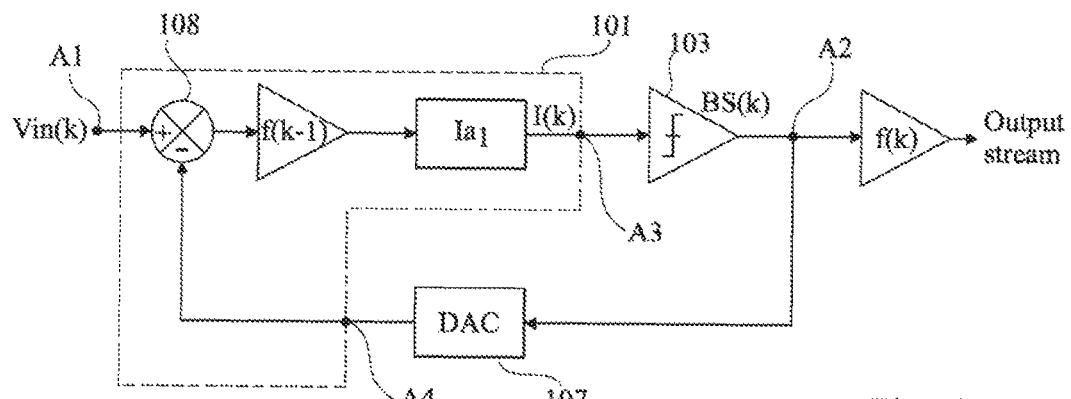
FIG. 10 illustrates, in the form of blocks, another embodiment of a sigma-delta converter.

FIG. 10 illustrates, in the form of blocks, another embodiment of a sigma-delta converter. The converter of FIG. 10 is a converter of order 1, comprising a sigma-delta converter of order 1, and a digital filter of order 1.

The sigma-delta modulator of FIG. 10 comprises an input terminal A1 intended to receive an analog input signal Vin to be digitized, and an output terminal A2 intended to supply a series of binary samples BS representative of signal Vin. The modulator of FIG. 10 comprises an analog integration circuit 101 comprising a first input connected to terminal A1 of application of signal Vin, and an output A3 connected to the input of a 1-bit analog-to-digital conversion circuit 103, for example, a 1-bit comparator. The output of converter 103 is connected to output A2 of the modulator, and is further connected by a feedback loop to a second input A4 of integration circuit 101. In the shown example, the feedback loop comprises a 1-bit digital-to-analog converter 107 (DAC) having its input connected to terminal A2 and having its output connected to terminal A4. For each cycle k of duration $T_{OSR}$ of a phase of conversion of input signal Vin into a digital value, k being an integer in the range from 0 to OSR, integration circuit 101 takes an analog sample Vin(k) of the input signal, and the modulator supplies, at the output of 1-bit analog-to-digital converter 103, a binary sample BS(k) of the output signal. In the example of FIG. 10, integration circuit 101 comprises a single analog integrator $Ia_1$, for example, a simple analog adding circuit comprising an input and an output, the circuit being capable, at each cycle, of incrementing the value of the output signal (or integrated signal) by the value of the signal applied at the integrator input. In the example of FIG. 10, integrator $Ia_1$ receives on its input a signal equal to the difference between input signal Vin(k) and the feedback signal applied to terminal A4 (corresponding to the analog value of signal BS(k−1)), weighted by a coefficient f(k−1) variable according to a predetermined law f. The difference operation is symbolized by a subtractor 108. The output of integrator $Ia_1$ is connected to output terminal A3 of circuit 101.

The digital filter of the sigma-delta converter of FIG. 10 comprises a digital integrator (not shown), for example, a counter, having its input connected to output A2 of the modulator via a digital circuit of application of a weighting coefficient f(k) variable according to law f. In this example, variable law f is applied at the digital filter one cycle ahead of the modulator.

It should be noted that the input data of the digital filter is the binary output data of the sigma-delta modulator, and that the resolution of the internal data of the digital filter depends on the OSR and on the resolution of weighting law f. The resolution of weighting law f in the digital filter is preferably greater than or equal to the resolution of law f in the modulator.

The following equations formalize, for an example of a sigma-delta converter described in relation with FIG. 10, the performance improvement linked to the application of a variable weighting law in the modulator.

A decreasing exponential law f given by equation $f(k)=q^k$, with $q \in ]0, 5; 1]$, is here considered. It is further considered that the dynamic range of input signal Vin is limited and fulfils relation $|Vin| \le q-0, 5$. It is further considered that output value BS(k) of the sigma-delta modulator can take value 1 or −1 for $k \ge 1$, and is set to 0 for k=0. In this example, digital-to-analog converter 107 supplies on terminal A4 an analog value equal to 0.5*BS(k−1).

For a OSR equal to m (m being an integer greater than or equal to 1), output I(m) of the analog integrator may be written as:

$$I(m) = \sum_{k=0}^{m-1} q^k Vin(k) - 1/2 \sum_{k=0}^{m-1} q^k BS(k) \quad (1)$$

with $$BS(k) = \text{sign}(I(m)) \quad (2)$$

Sequence U(m) representing the difference between the accumulated energy originating from DC input signal Vin and the accumulated energy originating from the feedback performed by the sigma-delta modulator is defined as follows. Sequence U(m) represents the difference between the energy introduced by the signal and its estimate.

$$U(m) = I(m) - \frac{1}{2} q^m BS(m) = \sum_{k=0}^{m-1} q^k Vin(k) - \frac{1}{2} \sum_{k=0}^{m} q^k BS(k) \quad (3)$$

To show the advantage of the sigma-delta modulator of FIG. 10 over a conventional sigma-delta modulator of order 1, it is here demonstrated that the following assertion P(m) is valid for any $m \ge 1$:

$$P(m): |U(m)| \le \frac{1}{2} q^m \quad (4)$$

It is first shown that for m=1, assertion P is verified.

For $0 \le Vin \le q-0.5$, BS(1)=1. Then, $-0.5q \le Vin-0.5q \le 0.5(q-1)$, and thus $-0.5q \le U(1) \le 0.5q$. The same result is obtained for a negative input Vin. Assertion P (equation (4)) is thus verified for m=1.

It can further be shown that for any $m \ge 1$, if P(m) is verified, then P(m+1) is verified.

For $I(m+1)=U(m)+q^m Vin \ge 0$, BS(m+1)=1. Then, $0 \le U(m)+q^m Vin \le 0.5*q^m+q^m Vin$, that is $-0.5*q^{m+1} \le U(m)+q^m Vin-0.5*q^{m+1} \le 0.5*q^m+q^m Vin-0.5*q^{m+1}$, that is $-0.5*q^{m+1} \le U(m+1) \le q^m(0.5+Vin-0.5*q)$. Given that $0.5+Vin-0.5*q \le 0.5*q$, $-0.5*q^{m+1} \le U(m+1) \le 0.5*q^{m+1}$. Similarly, it can be shown that if $I(m+1)=U(m)+q^m Vin \le 0$, then P(m+1) is verified if P(m) is verified.

It can be deduced from the foregoing that assertion P (equation (4)) is valid for any $m \ge 1$.

As a result $$\left| Vin - \frac{1}{2} \frac{\sum_{k=0}^{m} q^k BS(k)}{\sum_{k=0}^{m-1} q^k} \right| \le \frac{1}{2} \frac{q^m}{\sum_{k=0}^{m-1} q^k} \quad (5)$$

The estimated value $Vin_q$ of signal Vin is then defined by equation (6) hereafter, with an estimation error $e_q$ defined by equation (7).

$$Vin_q = \frac{1}{2} \frac{\sum_{k=0}^{m} q^k BS(k)}{\sum_{k=0}^{m-1} q^k} \quad (6)$$

$$e_q = \frac{q^m}{\sum_{k=0}^{m-1} q^k} \quad (7)$$

For q=1, which corresponds to a standard sigma-delta converter (with no modulation of a coefficient by a variable law), error $e_q$ is 1/m.

For m≥1, it can be shown that $$\frac{q^m}{\sum_{k=0}^{m-1} q^k} \le \frac{1}{m} \quad \left(\text{equivalent to } \frac{q^m(1-q)}{1-q^m} \le \frac{1}{m}\right) \qquad (8)$$

due to the fact that: $q^m(m - mq + 1) \le 1$ (9)

Indeed, the maximum of term $q^m(m-mq+1)$ is reached when the derivative of this term (with respect to q) cancels, that is, for q=1.

As a result of the foregoing, for a given OSR value m, the modulator of FIG. 1 converges faster for q∈]0.5; 1[ than for q=1 (standard modulator, with no weighting by a variable law).

Figure 11:
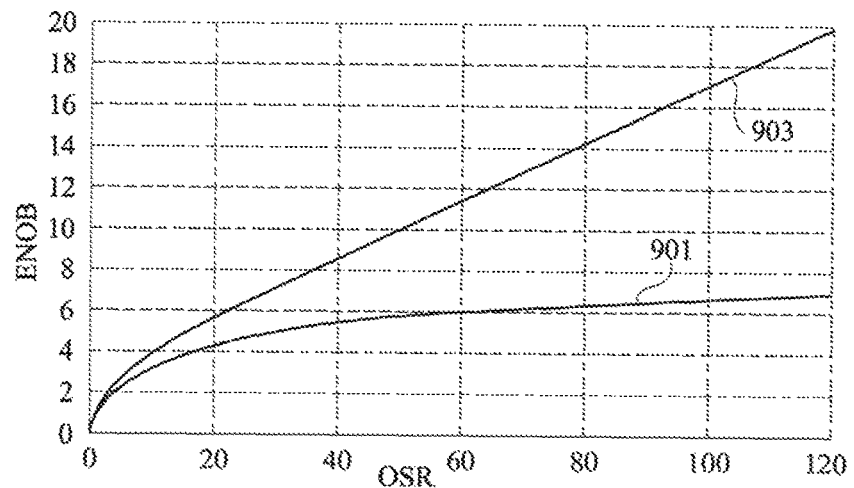
FIG. 11 is a diagram illustrating the behavior of the sigma-delta converter of FIG. 10.

FIG. 11 is a diagram illustrating the variation, according to the OSR, of the theoretical effective number ENOB defined by $$ENOB = \log_2\left((2q-1) \Bigg/ \left(\frac{q^m}{\sum_{k=0}^{m-1} q^k}\right)\right) \qquad (10)$$

More particularly, FIG. 11 comprises a curve 901 illustrating the variation of the theoretical effective number of bits ENOB for q=1 (case of a standard converter), and a curve 903 illustrating the variation of the theoretical effective number of bits ENOB for q=1/1.1 (case of a converter with the weighting of a coefficient of the modulator by a decreasing exponential law). It can be observed in the diagram of FIG. 11 that whatever the considered OSR, the theoretical effective number of bits ENOB is higher for q=1/1.1 than for q=1, and that the difference is all the higher as the OSR is high. As an example, for an OSR equal to 80, a difference of next to 8 bits can be observed between case q=1/1.1 and case q=1.

Figure 12:
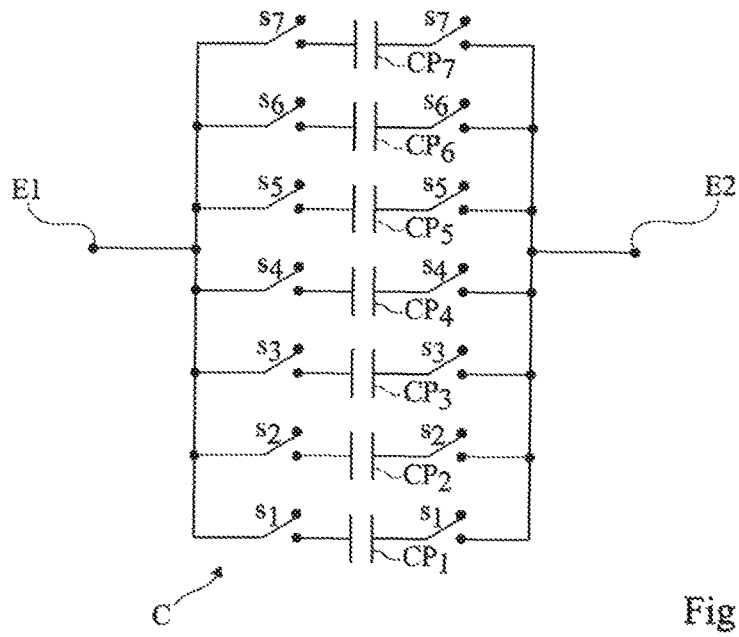
FIG. 12 is an electric diagram of an embodiment of a circuit enabling to dynamically vary a weighting coefficient of a sigma-delta modulator.

FIG. 12 is an electric diagram of an embodiment of a circuit enabling to dynamically vary a weighting coefficient of a sigma-delta modulator according to a variable law f.

In this example, it is considered that the OSR coefficients f(k) of law f are quantized over a number n of bits (n=6 in the shown example). It is further considered that the weighting coefficient which is desired to be dynamically modulated is set by the capacitance of a capacitor C.

Instead of having a fixed capacitance value as in a modulator of the type described in relation with FIG. 2, capacitor C is, in this example, a digitally controllable variable-capacitance capacitor, formed by means of a switched capacitor table.

More particularly, in the example of FIG. 12, capacitor C is divided into n+1 capacitors $CP_1$ to $CP_{n+1}$. The values of capacitances $CP_1$ to $CP_n$ are obtained by dichotomous division of the value of capacitance $C_{base}$ corresponding to the basic coefficient (non-weighted). Thus, capacitances $CP_1$, $CP_2$, ... $CP_n$ respectively have values $C_{base}/2$, $C_{base}/4$, ... $C_{base}/2^n$. Capacitance $CP_{n+1}$ has the same value as capacitance $CP_n$. Thus, the sum of the values of capacitances $CP_1$ to $CP_{n+1}$ is equal to $C_{base}$.

The variable-capacitance capacitor C of FIG. 12 comprises, between conduction terminals E1 and E2, n+1 parallel branches each comprising one of the n+1 capacitors $CP_q$, q being an integer in the range from 1 to n+1, and two switches $s_q$ controlled by a same control signal (or by very slightly shifted control signals, for example, having a time shift smaller than $0.1*T_{OSR}$), connecting the electrodes of capacitor $CP_q$ respectively to terminal E1 and to terminal E2.

A control circuit, not shown, may be provided to control switches $s_q$ to dynamically vary the capacitance of a capacitor C during a phase of analog-to-digital conversion of the input signal of the sigma-delta converter.

To weight the coefficient concerned by a value f(k)=1, all switches $s_q$ may be turned on. The capacitance of capacitor C is then equal to $C_{base}$.

For all other values (smaller than 1 in this example) of law f(k), switches $s_{n+1}$ are off, and the digital value over n bits of law f(k) is applied to the control signals of switches $s_1$ to $s_n$, the most significant bit being applied to switches $s_1$, and the least significant bit being applied to switches $s_n$.

As an example, to form a sigma-delta modulator of the type described in relation with FIG. 5A, it may be started from a circuit of the type described in relation with FIG. 2, where capacitors co2, Cs5, cff1, and cff2 are replaced with variable capacitors of the type described in relation with FIG. 12.

An advantage of the circuit of FIG. 12 is that weighting law f(k) may be easily reconfigured, for example, if the needs of the application change.

The described embodiments are however not limited to the example of a circuit of FIG. 12 for dynamically varying coefficients of a sigma-delta modulator according to a predetermined law. More generally, any other adapted circuit may be used, for example, a variable-capacitance circuit with an analog or digital control.

Specific embodiments have been described. Various alterations, modifications, and improvements will readily occur to those skilled in the art.

In particular, only discrete implementations with switched capacitors, where the analog signal to be digitized is a voltage and is sampled from capacitors of the sigma-delta modulator (example of FIG. 2), has been considered herein. The described embodiments are not limited to this specific case. As a variation, the provided solution may be adapted to sigma-delta modulators with an analog current input. In this case, the weighting of the signals internal to the modulator by a variable law may for example be performed by modulating the times of integration of the currents on capacitors. For continuous-time modulators, the weighting law will no longer be discrete (f(k)) but continuous (f(t)).

It should further be noted that the provided solution may be adapted to MASH-type ("Multi Stage Noise Shaping") sigma-delta modulators, that is, modulators of order p greater than 1 formed by the serializing of a plurality of sigma-delta modulators having an order smaller than p, each modulator having an order smaller than p comprising, as in the above-described modulators, an analog integration circuit, a 1-bit analog-to-digital converter, and a feedback loop capable of comprising a digital-to-analog converter and a subtractor. The operating principle of MASH-type sigma-delta modulators is for example described in article "Sturdy MASH Δ-Σ modulator" of Maghari et al. (ELECTRONICS LETTERS 26th Oct. 2006 Vol. 42 No. 22). As in the above-described examples, the signals having the weighting law f(k) applied thereto are selected so that at least one weighting by law f(k) is performed upstream of an analog integrator of the modulator and preferably so that the different signals added or subtracted in the modulator and/or in the digital filter of the converter are at the same scale.

It should further be noted that in the above-described examples, the analog input signal is applied at the input of analog integration circuit 101 of the modulator, and 1-bit analog-to-digital converter 103 of the modulator compares an output signal of circuit 101 with a constant reference signal. As a variation, the input signal and the reference signal may be interchanged. In this case, the inventors have observed that if the coefficients of the modulator are fixed, the output noise of the sigma-delta modulator is relatively high. However, the application of a variable weighting law on coefficients of the modulator enables to significantly improve the accuracy of the converter. An advantage of this alternative embodiment is that the reference input of comparator 103 is a high-impedance input. Thus, the application of the signal to be directly converted on the comparator enables to avoid drawing power from the signal to be digitized.

Further, embodiments of sigma-delta modulators comprising one or a plurality of cascaded analog integrators have been described hereabove. The described embodiments are not limited to this specific case. More generally, in the described embodiments, the analog integrators of the sigma-delta modulators may be replaced with other types of analog filters.

Figure 13:
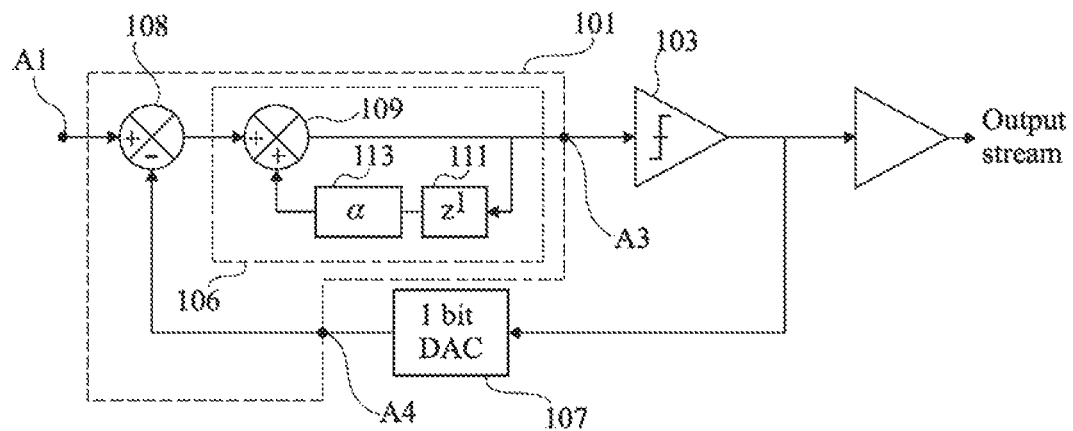
FIG. 13 illustrates, in the form of blocks, another embodiment of a sigma-delta converter of order 1.

FIG. 13 illustrates in the form of blocks another embodiment of a sigma-delta modulator of order 1. In FIG. 13, only the sigma-delta modulator of the converter has been shown. One can find, as in FIG. 10, analog integration circuit 101, 1-bit analog-to-digital conversion circuit 103 and 1-bit digital-to-analog converter 107, and subtractor 108. Unlike in FIG. 10, analog filter 106 of analog integration circuit 101 shown in FIG. 13 comprises a summing element 109, a lag operator 111 having a unity gain, noted $Z^{-1}$, and a multiplier 113 enabling to multiply the output signal of operator 111 by a factor $\alpha$. Summing element 109 adds the analog signal received at cycle k and a signal internal to the analog filter originating from operator 111 multiplied by coefficient $\alpha$. The output of summing element 109 supplies the input of operator 111 and forms output A3 of integration circuit 101. Thus, the signal internal to the analog filter originating from operator 111 forms the output of the analog filter at cycle k−1. By selecting a value of coefficient $\alpha$ greater than 1, the contribution to the output value of the analog filter at point A3 of the analog input signal of summing element 109 originating from subtractor 108 at cycle k is smaller than its contribution to the analog filter at the previous cycle k−1. It is sufficient for coefficient $\alpha$ to be greater than 1 during at least one cycle during the conversion phase for the contribution condition to be respected. It is of course possible to provide a coefficient $\alpha$ greater than 1 for a plurality of cycles or even for all the cycles of a conversion phase.

Figure 14:
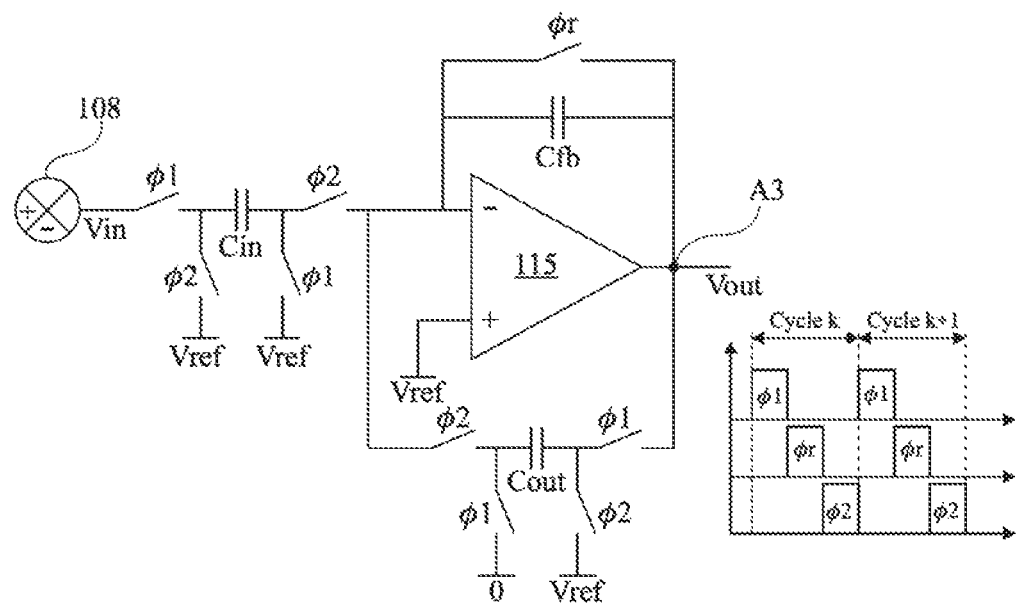
FIG. 14 illustrates an embodiment of an analog filter capable of being implemented in the embodiment of FIG. 13.

The functional blocks shown in FIG. 13 may be formed in many ways, one of which is explained in FIG. 14. It is of course possible to form the summing element, 109, operator 111, and multiplier 113 in other forms according to components existing on the market and to their user-friendliness.

In FIG. 14, the summing element, 109, operator 111, and multiplier 113 are formed from an operational amplifier 115 receiving on its inverting input the internal signal originating from subtractor 108 via a capacitor Cin. Switches Φ1 and Φ2 enable to connect capacitor Cin either to the output of summing element 108, or to a reference voltage Vref, or to the inverting input. The inverting input is connected to the output of operational amplifier 115 via a capacitor Cfb which may be shorted by a switch Φr. The inverting input is also connected to the output of operational amplifier 115 via a capacitor Cout which may be switched by switches, also called Φ1 and Φ2. Although the switches switching capacitors Cin and Cout are different, same designations are used for simultaneously controlled switches. A timing diagram is shown in FIG. 14 to show the sequence per cycle of three phases of switching of switches Φ1, Φ2, and Φr. To simplify the understanding, the three phases Φ1, Φ2, and Φr are called by the designation of the switches which are on during each of the phases.

During phase Φ1, the following quantities of charges are present on capacitors Cin and Cout:

$$Qcin=Cin*(Vref-Vin(k))$$

$$Qcout=Cout*(0-Vout(k-1))$$

During phase Φr, the integrator formed of amplifier 115 with capacitor Cfb is reset by shorting Cfb. Its charge Qcfb becomes zero.

During phase Φ2, all charges Qcin and Qcout are transferred onto capacitor Cfb. One then has:

$$Qcin+Qcout=Cfb*(Vref-Vout(k))$$

By solving this expression with Cin=Cfb=C, and setting Cout=$\alpha$*C, one obtains:

$$Vout(k)=Vin(k)+\alpha*Vout(k-1)$$

The ratio of the values of capacitors Cout on the one hand to Cfb and Cin on the other hand provides the value of coefficient $\alpha$.

Based on the example of FIG. 10, the advantage of the invention has been shown hereabove based on the example of a decreasing exponential law which is a function of rank k of the cycle: $f(k)=q^k$. To obtain the same result in the variation described based on FIG. 13, coefficient $\alpha$ may be given a value equal to 1/q.

Weight $\alpha$ of the integrator is constant; 1/q, but the contribution of the input signal of the integrator in the integrator decreases according to law $f(k)=q^k$. Further, the weighting of the output of the digital filter may follow law f(k) (or f(k+1)) given the theoretical application shift between the modulator and the digital filter. Another decreasing law may also be selected for the digital filter.

The alternative embodiment described based on FIGS. 13 and 14 has the advantage of not necessarily introducing a scale factor at the output of integration circuit 101. There however is a risk of saturation of the integrator due to a gain greater than 1.

In the variation described by means of FIG. 10, for each cycle, the weighting of each input signal of integrator $Ia_1$ is provided by $q^k$, so that the contribution of the input signal to the value of the integrator follows relation:

$$\frac{q^k}{\sum_{i=1}^{k-1} q^i}$$

In the variation described by means of FIG. 13, for each cycle, the contribution of the input signal to the value of integrator 106 follows relation:

$$\frac{1}{\sum_{i=1}^{k-1} \frac{1}{q^i}}$$

The two relations are fully equivalent.

Another way to express the equivalence of the two weightings is to define, in the variation illustrated in FIG. 10, the weighting at the input of the integrator by $\beta_k$ (k varying from 1 to OSR) and by $\alpha_k$ the gain of the integrator at rank k in the variation illustrated in FIG. 13.

One then has:

$$\beta_k = \prod_{i=1}^{k} \frac{1}{\alpha_i}$$

It is necessary to fulfill condition $\beta_k<\beta_{k-1}$ (or at least one $\alpha_k>1$ in an integrator) for at least a given rank k so that the contribution of a signal at the integrator input has a decreasing phase during a conversion of OSR cycles.

An advantage of an exponential decrease at the integrator input (FIG. 10) relates to power consumption. Indeed, in an embodiment with switched capacitors, the power consumption linked to the charge of capacitors of decreasing value enables to decrease the dynamic power consumption. However, such an attenuation of the gain may cause an increase in the temporal noise. However, in certain imaging applications, for example, the linearity of the digital value generated at the converter output is greater than the temporal noise on this digital value. Indeed, on a series of images, the eye will tend to smooth or to average the temporal noise and will thereby be more sensitive to linearity errors (here considering a population of digital output values relative to a plurality of conversions of a same analog static input value, the noise is relative to the standard deviation of the population and the linearity error is relative to the difference between the expected theoretical digital value and the average of the population). Thus, as demonstrated hereabove, the provided invention, and particularly its variation explained from FIG. 10, nevertheless decreases the linearity error.

With the variation provided based on FIG. 13, where the integrator gain is multiplied by 1/q, linearity is gained while the noise is only slightly affected since the amplitude (or more specifically the envelope) of the signals is not attenuated at the integrator input and output.

The variation explained by means of FIG. 10 and the variation explained by means of FIG. 13 may be combined to avoid the risk of saturation at the integrator. This combination for example comprises applying a weighting law to the input signal of integrator $Ia_1$, for example of type $f(k)=q^k$, with k varying from 1 to OSR, according to the variation of FIG. 10, and at least once and advantageously periodically every N cycles within the OSR cycles, resetting the weighting law and while applying to the integrator a corresponding gain according to the variation of FIG. 13. The weighting law then follows law q at power (k-n*integral portion of(k/n)) and every N cycles, a gain $(1/q)^N$ is applied to the integrator.

Figure 15A:
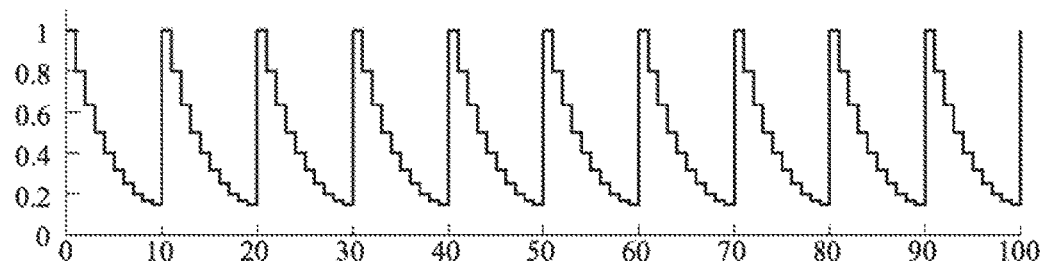
FIGS. 15a and 15b illustrate in the form of a timing diagram the time variation of coefficients applied to the modulator of the converter of FIG. 13.

FIG. 15a shows in the form of a timing diagram having its time axis expressed in number of cycles the variation of the weighting at the integrator input according to the variation of FIG. 10. In this example, law f is in the form of $f(k)=q^k$ with q=0.8. Total number OSR of cycles to generate a digital output value is 100 and number N of cycles at the end of which the weighting at the integrator input is reset is 10. At the first cycle of the conversion phase, the weight is 0.8 and follows relation $0.8^k$ up to the tenth cycle and is then reset to 1 at the eleventh cycle. Such a decrease followed by a reset is repeated every 10 cycles up to OSR=100.

Figure 15B:
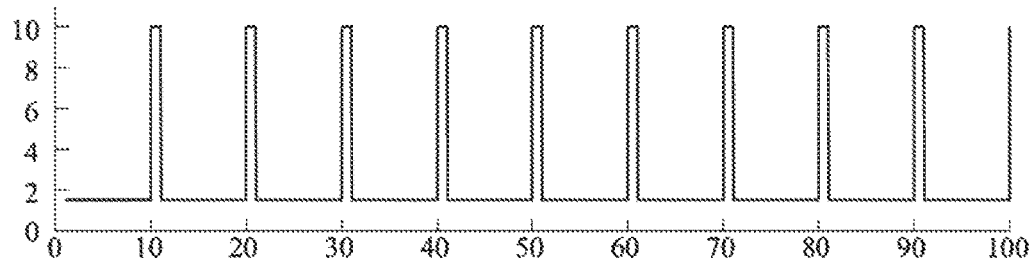

FIG. 15b shows in the form of a timing diagram with the same time axis the weighting applied to the integrator gain according to the variation of FIG. 13. Every N cycles, 10 in the shown example, gain a of the integrator (initially equal to 1) is multiplied by $(1/q)^N$, that is, $(1/0.8)^{10} \approx 9.31$, and is then reset to its initial value at the next cycle.

Thus, the property of a contribution of the integrator input value which follows Ia f(k) is kept. In this combination, the saturation risk is decreased and the noise robustness is increased due to the lower attenuation occurring on the integrator input signal.

Another combination of the two variations of FIGS. 10 and 13 comprises simultaneously applying, at least for a same rank k, at least a weighting at the integrator input and a gain in the integrator.

Figure 16:
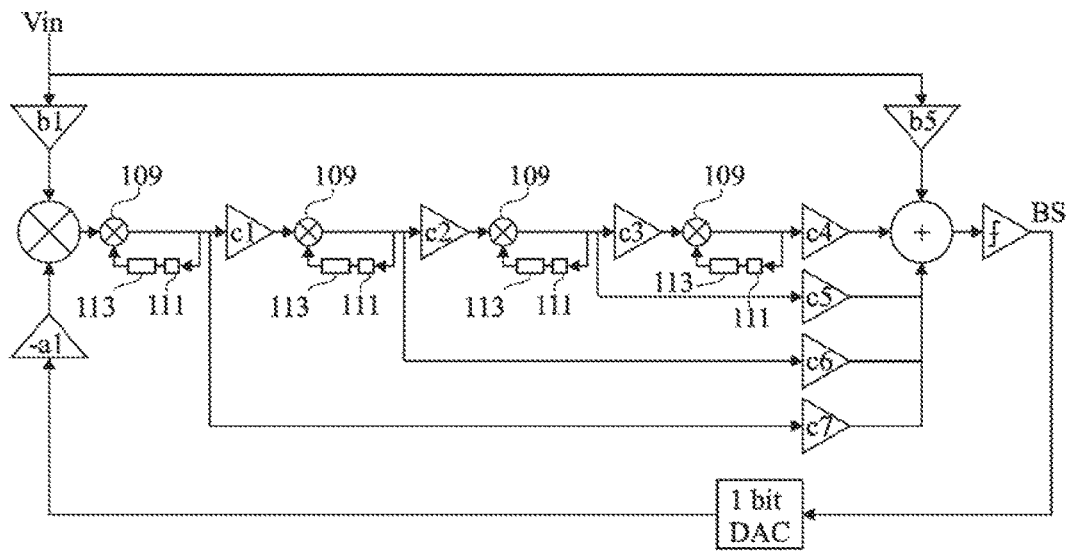
FIG. 16 illustrates, in the form of blocks, a generalization of the example of FIG. 13 to converters having an order greater than 1.

It has been seen hereabove by means of FIG. 5a that the variation of FIG. 10 may be generalized to converters having an order greater than 1 comprising a plurality of cascaded analog filters. The same is true for the variation disclosed by means of FIG. 13 which may be generalized to converters having an order greater than 1. Such a generalization is disclosed in FIG. 16, where each integrator Ia1 to Ia4 of FIG. 1a is replaced with a summing element 109, an operator 111, and a multiplier 113. It is of course possible to only replace at least one of integrators Ia1 to Ia4 of FIG. 1a by a summing element 109, an operator 111, and a multiplier 113.

In the case where a plurality of multipliers 113 are present, the factor $\alpha$ of each of them may be different, to adjust the output variation ranges of the analog integrator filters. The digital filter is then advantageously adapted according to the different factors $\alpha$.

It has been specified hereabove that a diversity of alternative digital filter architectures may be envisaged. In particular, the topology of the digital filter may be modified to approach that of the sigma-delta modulator. In the case of a modulator with cascaded analog filters, it is advantageous to form the digital filter by means of elementary filters of same types and cascaded in the same way. Filter of the same type for example means high-pass, low-pas, bandpass, integrator . . . filters, which will be analog in the modulator and digital in the digital filter.

In the specific case of cascaded digital integrators, different elementary filters may be equivalently used. It is for example possible to provide two elementary filter variations. In the first variation, a unity gain integrator is preceded by a multiplier, such as the modulator of FIG. 10. In the second variation, the elementary filter comprises a non-unity gain integrator such as the modulator of FIG. 13. Cascades of integrators according to the two variations are however totally equivalent and can both be implemented at the output of a modulator according to claim 10 or at the output of a modulator according to FIG. 13.

To prove this equivalence, the following table shows a cascade of two unity gain integrators preceded by a multiplier having coefficient $q^k$. In this table, it is considered that the filter input is unity:

| Rank k | Input of integrator 1 | Output of integrator 1 | Output of integrator 2 |
|---|---|---|---|
| 1 | $q$ | 0 | 0 |
| 2 | $q^2$ | $q$ | 0 |
| 3 | $q^3$ | $q^2 + q$ | $q$ |
| 4 | $q^4$ | $q^3 + q^2 + q$ | $q^2 + 2q$ |
| 5 | $q^5$ | $q^4 + q^3 + q^2 + q$ | $q^3 + 2q^2 + 3q$ |

The output value of the second integrator is equal to:

$$\sum_{i=1}^{k-2}((k-2)-i+1)q^i$$

The ratio of the output of the second integrator to the input of the first integrator for an interval of two rows k is equal to:

$$\frac{\sum_{i=1}^{k-2}((k-2)-i+1)q^i}{q^{k-2}}$$

The following table exhibits a cascade of two integrators with a 1/q gain:

| Rank k | Input of integrator 1 | Output of integrator 1 | Output of integrator 2 |
|---|---|---|---|
| 1 | 1 | 0 | 0 |
| 2 | 1 | 1 | 0 |
| 3 | 1 | $1 + q^{-1}$ | 1 |
| 4 | 1 | $1 + q^{-1} + q^{-2}$ | $1 + 2q^{-1}$ |
| 5 | 1 | $1 + q^{-1} + q^{-2} + q^{-3}$ | $1 + 2q^{-1} + 3q^{-2}$ |

The output of integrator 2 and the ratio of the output of the second integrator to the input of the first integrator for an interval of two ranks k are equal to $$\frac{\sum_{i=1}^{k-2}((k-2)-i+1)q^i}{q^{k-2}}$$

The two ratios are effectively identical, which shows the equivalence of the two alternative digital filters. This equivalence has been shown for a cascade of two filters. Of course, the equivalence between the two variations is obtained whatever the number of cascaded elementary filters.

Figure 17:
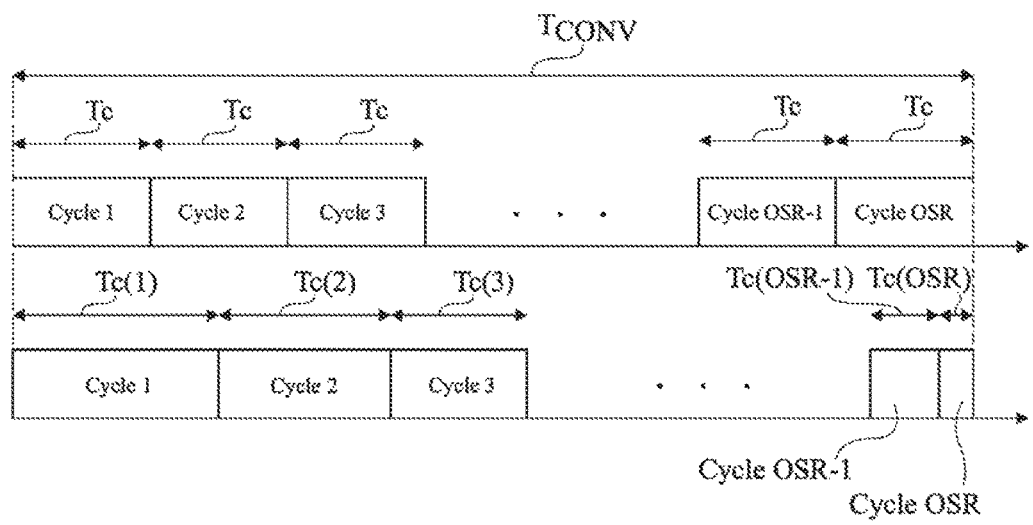
FIG. 17 schematically illustrates the operation of a sigma-delta converter according to an embodiment.

FIG. 17 schematically illustrates the operation of a sigma-delta converter according to an embodiment.

In the previously-described embodiments of sigma-delta converters, in particular in relation with FIGS. 10 and 13, the contribution to at least one analog filter of an internal analog signal originating from analog input signal Vin(k) is smaller at a given cycle k of a conversion phase than at a previous cycle k−1 of the conversion phase. However, in all the previously described examples, the OSR operating cycles of the conversion phase have substantially the same duration $T_C=T_{OSR}$, for example, equal to $T_{CONV}/OSR$, where $T_{CONV}$ designates the total duration of the conversion phase. This operation is illustrated by the timing diagram shown in the upper part of FIG. 17, illustrating the time distribution of the OSR successive operating cycles of a phase of analog-to-digital conversion of duration $T_{CONV}$.

According to an aspect of an embodiment, it is provided, in a sigma-delta converter of the previously-described type, where the contribution to at least one analog filter of an internal analog signal originating from input analog signal Vin(k) is smaller at a given cycle k of a phase of conversion than at a previous cycle k−1 of the conversion phase, to vary the duration of the operating cycles according to a predetermined law $T_c$ which is a function of rank k of the cycle in the conversion phase, so that the duration $T_c(k)$ of at least one given cycle k of the conversion phase is shorter than duration $T_c(k-1)$ of a previous cycle k−1 of the conversion phase. This operating mode is illustrated by the timing diagram shown in the lower part of FIG. 17, illustrating the time distribution of the OSR successive operating cycles of a phase of analog-to-digital conversion of duration $T_{CONV}$.

An advantage of this embodiment will now be explained in relation with FIG. 18.

Figure 18:
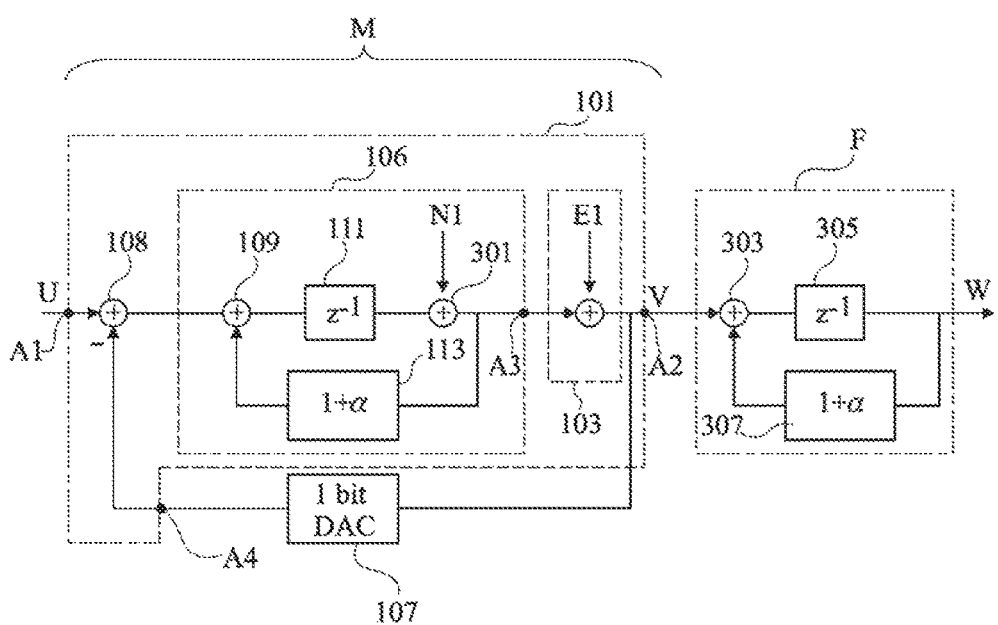
FIG. 18 illustrates, in the form of blocks, an embodiment of a sigma-delta converter of order 1.

FIG. 18 illustrates in the form of blocks another embodiment of a sigma-delta modulator of order. In FIG. 18, sigma-delta modulator M and digital filter F of the converter have been shown.

For modulator M, one can find, as in FIG. 13, a subtractor 108, an analog filter 106, a 1-bit analog-to-digital conversion circuit 103, and a feedback loop comprising a 1-bit digital-to-analog converter 107. The positive input of subtractor 108 is connected to a terminal A1 of application of an input signal of the converter, the output of subtractor 108 is connected to the input of analog filter 106, output A3 of analog filter 106 is connected to the input of 1-bit analog-to-digital converter 103, and output A2 of the 1-bit analog-to-digital converter 103 is connected to the negative input A4 of subtractor 108 via 1-bit digital-to-analog converter 107. In the example of FIG. 18, the 1-bit analog-to-digital is shown in the form of a summing element adding to the output signal of analog filter 106 a quantization noise E1 introduced by converter 103. Analog filter 106 comprises a summing element 109, a lag operator 111 with a unity gain noted $Z^{-1}$, and a multiplier 113 enabling to multiply the signal of operator 111 by a factor 1+α, where α is a positive coefficient. A first input of summing element 109 is connected to the input of filter 106, that is, to the output of subtractor 108. The output of summing element 109 is connected to the input of operator 111, the output of operator 111 being connected to the output of analog filter 106. Multiplier 113 connects the output of analog filter 106 to a second input of summing element 109. In the example of FIG. 18, a temporal noise N1 associated with analog integrator 106 has further been shown. More particularly, in this example, noise N1 is added to the output signal of operator 111 via a summing element 301 placed between the output of operator 111 and the output of analog filter 106. For each operating cycle k of the sigma-delta converter, summing element 109 adds the signal received at cycle k at the input of analog filter 106 and a signal internal to filter 106 corresponding to the sum of the signal originating from operator 111 and of signal N1, multiplied by factor 1+α.

Digital filter F comprises a summing element 303, a lag operator 305 with a unity gain, noted $Z^{-1}$, and a multiplier 307 enabling to multiply the signal of operator 305 by factor 1+α. A first input of summing element 303, corresponding to the input of filter F, is connected to output terminal A2 of modulator M. The output of summing element 303 is connected to the input of operator 305, the output of operator 305 being connected to the output of digital filter F. Multiplier 307 connects the output of operator 305 to a second input of summing element 303. For each operating cycle k of the sigma-delta converter, summing element 303 adds the signal received at cycle k to the input of digital filter F and a signal internal to filter F corresponding to the signal originating from operator 305 multiplied by factor 1+α.

Call U the input signal of modulator M applied to terminal A1, V the output signal of modulator M supplied on terminal A2, and W the output signal of digital filter F output by operator 305.

Based on the diagram of FIG. 18, the following relation can be written:

$$V = z^{-1}U + (1-(1+\alpha)z^{-1})E1 + N1 = STF \cdot U + NTF \cdot E1 + N1$$

where STF and NTF respectively designate the signal transfer function and the noise transfer function of the sigma-delta modulator. It can be seen that in this case, quantization noise E1 is shaped by the NTF, which forms a high-pass filter. However, input signal U as well as the temporal noise N1 associated with the analog integrator are transferred to the output of the modulator with no attenuation.

At the output of digital filter F, the following relation is obtained:

$$W = \frac{z^{-2}}{1-(1+\alpha)z^{-1}}U + z^{-1}E1 + \frac{z^{-1}}{1-(1+\alpha)z^{-1}}N1$$

The equivalent of this last relation in the discretized time domain is provided by the following relation:

$$W(n) = \sum_{k=1}^{n-2}(1+\alpha)^{k-1}U_{n-k-1} + \sum_{k=1}^{n-2}(1+\alpha)^{k-1}N1_{n-k} + E1_{n-1}$$

After normalization, the rms ("root mean square") contribution S of noise N in signal W(k) can be expressed by relation:

$$S = \frac{\sqrt{\sum_{k=1}^{n-2}(1+\alpha)^{2(k-1)}N1_{n-k}^2}}{\sum_{k=1}^{n-2}(1+\alpha)^{k-1}}$$

In the case of a noise N1 of constant power $\sigma^2$ from one cycle to the other, contribution S becomes:

$$S = \frac{\sqrt{\sum_{k=1}^{n-2}(1+\alpha)^{2(k-1)}\sigma^2}}{\sum_{k=1}^{n-2}(1+\alpha)^{k-1}}$$

When $\alpha=0$, the conventional relation reflecting the noise spreading on a band which is OSR times wider than the original band (linked to the oversampling with a factor OSR=n−2) can be found:

$$S = \sqrt{\frac{\sigma^2}{n-2}}$$

The above equations highlight the advantage of having a factor $\alpha$ greater than 0, which will enable to attenuate the contribution of quantization noise E1 in the normalized output code. However, on the other hand, noise N1 or, more generally, any noise source which is not shaped by the NTF as quantization noise E1, is amplified.

The above expression of value S according to N1 further shows that, when coefficient $\alpha$ is non-zero, the contribution of samples $N1_k$ of noise N1 is not constant but decreases according to rank k of the cycle in the conversion phase. In other words, the noise N1 associated with the first cycle contributes more than the noise N1 associated with the next cycle, and so on.

The operating mode discussed in relation with FIG. 17 comprising varying the durations of the operating cycles of the conversion phase according to rank k of the cycles, by assigning longer durations to the initial cycles and then decreasing the duration of the next cycles, enables, without increasing the total conversion duration $T_{CONV}$, to decrease the contribution of the noise N1 which is not shaped by the NTF in the digital output value of the converter. Indeed, increasing the duration of the initial cycle times enables to decrease the bandpass of the analog filter for temporal noise N1 during these cycles, and thus to decrease the power of noise N1 in the initial cycles. On the contrary, decreasing the duration of next cycles results in increasing the passband of the analog filter with the effect of increasing the power of noise N during these cycles. However, as explained hereabove, when coefficient $\alpha$ is non-zero, the contribution of a sample $N1_k$ of noise N1 to the final signal is all the smaller as rank k of the cycle of the conversion phase is high. Thus, providing decreasing cycle times enables to decrease the total contribution of noise N1 in the final output value of the converter.

At least a decrease of the cycle time between two cycles of successive ranks of the conversion phase also provides an advantage. Preferably, law $T_c(k)$ governing the duration of the converter operating cycles according to rank k of the cycles is a decreasing law over the entire duration of conversion phase $T_{CONV}$, that is, it comprises no phase of increase of the cycle time between two successive cycles of the conversion phase. Law $T_c(k)$ for example is a continuous decreasing law over the entire duration of conversion phase $T_{CONV}$, as illustrated in FIG. 17. As a variation, law $T_c(k)$ is a law decreasing in stages, for example, in stages of a plurality of consecutive cycles, which has the advantage of simplifying the implementation of the cycle time variation in the converter.

As an illustration, an analog-to-digital conversion phase of duration $T_{CONV}$ comprising OSR=400 operating cycles, where the first 15 cycles have a duration t1, the next 20 cycles have a duration t2, and the remaining 365 have a duration t3, with $15*t1+20*t2+365*t3=T_{CONV}$, and with $t1=15*T_{CONV}/400$ and $t2=5*T_{CONV}/400$, is considered. As compared with an operating mode where all cycles during which a charge transfer operation between an input capacitor and an integration capacitor is carried out (such as in integrator Ia1 in FIG. 2 where the charges of capacitor Cs1 are transferred at each cycle into capacitor Ci1), have the same duration $t=T_{CONV}/400$, the power of noise N1 corresponding to the output noise of the integrator may be divided by 15 during the first 15 cycles by exploiting this additional time to decrease the passband of the integration assembly, by 5 during the next 20 cycles, and be multiplied by 5 during the 365 remaining cycles (t3=75*t/365=0.2t). When coefficient $\alpha$ is non-zero, the use of cycles having a longer duration at the beginning of the conversion enables to decrease the noise and to tend, for an equivalent conversion time, towards the noise of a standard structure ($\alpha=0$) where the duration of the cycle times is constant.

More generally, the operating mode of FIG. 17, comprising decreasing the duration of the operating cycles during the conversion phase, is advantageous in any sigma-delta converter where the contribution to at least one analog filter of an internal analog signal originating from analog input signal Vin(k) is smaller at a given cycle k of a conversion phase than at a previous cycle k−1 of the conversion phase, for example, a converter of the type described in relation with FIG. 10, where a signal internal to the analog filter is weighted by a variable coefficient.

To implement a sigma-delta converter with a variable cycle time, it may for example be provided to vary the value of one or of a plurality of capacitors of the analog filter of the modulator proportionally to the duration of the operating cycle. As a variation, the bandpass of the analog filter may be dynamically adjusted during the conversion phase by varying the bias current of the amplifier used to implement the analog filter.

Figure 19:
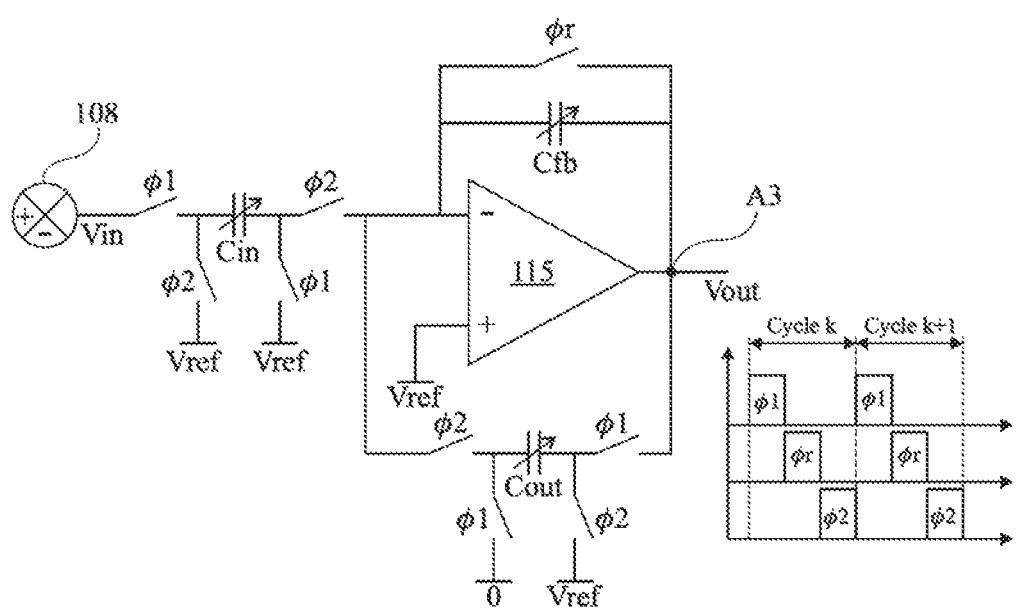
FIG. 19 illustrates an embodiment of an analog filter capable of being implemented in a sigma-delta converter according to an embodiment.

FIG. 19 illustrates an embodiment of an analog filter capable of being implemented in a sigma-delta converter of the type described based on FIG. 17.

The analog filter of FIG. 19 is substantially identical to the analog filter of FIG. 14, with the difference that, in the example of FIG. 19, capacitors Cin, Cout, and Cfb are variable capacitors. A timing diagram is shown in FIG. 19 to show the sequence per cycle of three phases of switching of switches Φ1, Φ2, and Φr. The operation is substantially identical to that of FIG. 14, that is, each operating cycle k of the modulator comprises a phase Φ1 of turning on switches Φ1, followed by a phase Φr of turning on switches Φr, followed by a phase Φ2 of turning on switches Φ2. However, unlike the example of FIG. 14, in the example of FIG. 19, the duration of the converter operating cycles varies during an analog-to-digital conversion phase. For each variation of the converter cycle time, the values of capacitances Cin, Cfb, and Cout are adjusted accordingly. Considering the above-mentioned illustrative example ($T_{CONV}=15*t1+20*t2+365*t3$), one may for example provide, as compared with a converter having a constant cycle time ($T_{CONV}=400*t$), multiplying capacitances Cin, Cfb, and Cout of the analog integrator by 15 during the first 15 operating cycles, by 5 during the next 20 cycles, and dividing them by 5 during the next 365 cycles.

Figure 20:
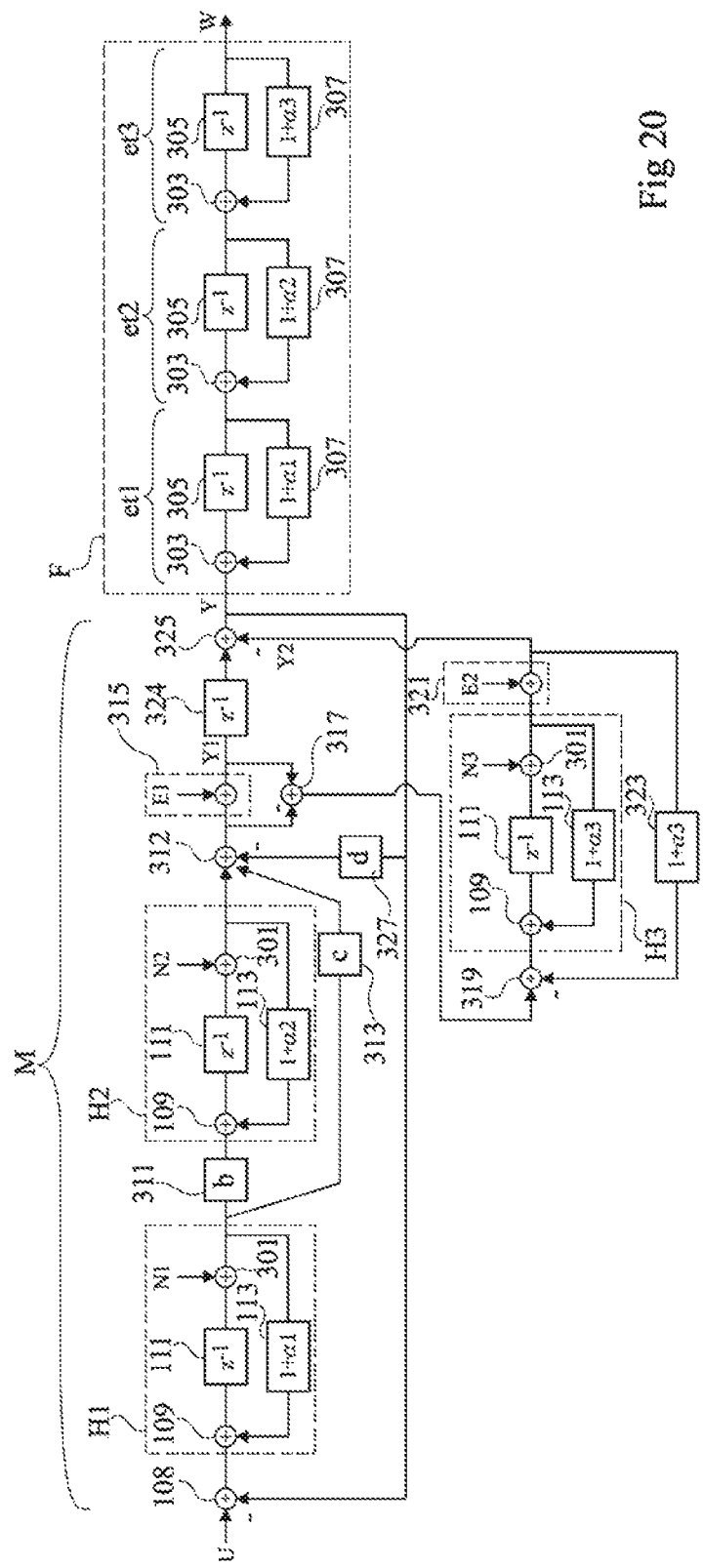
FIG. 20 illustrates, in the form of blocks, a generalization of the example of FIG. 19 to converters having an order greater than 1.

FIG. 20 illustrates in the form of blocks a generalization of the example of FIG. 19 to converters having an order greater than 1.

The converter of FIG. 20 corresponds to a specific example of implementation of a SMASH-type sigma-delta converter of order 3, formed from two sigma-delta sub-modulators of respective orders 2 and 1. The sigma-delta modulator M of the converter of FIG. 1 comprises three analog integrators H1, H2, H3, each having a structure identical or similar to that of analog integrator 106 of FIG. 18. Call N1, respectively N2, respectively N3, the temporal noise associated with integrator H1, respectively H2, respectively H3. Further, the multipliers 113 of integrators H1, respectively H2, respectively H3, apply multiplication coefficients 1+α1, respectively 1+α2, respectively 1+α3. Modulator M comprises, as in the example of FIG. 18, a subtractor 108 having its positive input connected to a terminal of application of an input signal of the converter. The output of subtractor 108 is connected to the input of integrator H1. The output of integrator H1 is connected to the input of integrator H2 via a multiplier 311 by a coefficient b. The output of integrator H1 is further connected to a first positive input of a summing/subtracting circuit 312 via a multiplier 313 by a coefficient c. The output of integrator H2 is connected to a second positive input of summing/subtracting circuit 312. Modulator M further comprises a first 1-bit analog-to-digital converter 315 having its input connected to the output of summing/subtracting circuit 312. 1-bit converter 315 is shown in the form of a summing element adding to the output signal of circuit 312 a quantization noise E1 introduced by converter 315. Modulator M further comprises a subtractor 317 outputting the difference between the output and the input of 1-bit converter 315. The quantization error signal thus generated is applied to the positive input of another subtractor 319 having its output connected to the input of integrator H3. The output of integrator H3 is connected to the input of a second 1-bit analog-to-digital converter 321. 1-bit converter 321 is shown in the form of a summing element adding to the output signal of integrator H3 a quantization noise E2. Modulator M further comprises a feedback loop connecting the output of 1-bit converter 321 to the negative input of subtractor 319 via a multiplier 323 by a coefficient 1+α3. Modulator M further comprises a lag operator 324 with a unity gain, noted $Z^{-1}$, having its input connected to the output of 1-bit converter 315, and a subtractor 325 having its positive input connected to the output of lag operator 324 and having its negative input connected to the output of 1-bit converter 321. The output of subtractor 325 forms the output of modulator M. The output of subtractor 325 is further connected to the negative input of subtractor 108, and to a negative input of summing/subtracting circuit 312 via a multiplier 327 by a coefficient d. Coefficients b, c, and d are coefficients of adjustment of the STF and of the NTF, for example, governed by the following equations:

$$b=c*(1+\alpha 2)-d*(1+\alpha 1)*(1+\alpha 2)$$

$$c=d^2-(1+\alpha 1)*(1+\alpha 2)$$

$$d=2+\alpha 1+\alpha 2$$

Digital filter F comprises three cascaded digital integration stages et1, et2, et3. Each stage comprises, as in the example of FIG. 18, a summing element 303, a lag operator 305 with a unity gain, noted $Z^{-1}$, and a multiplier 307. A first input of summing element 303 is connected to the stage input. The output of summing element 303 is connected to the input of operator 305. The output of operator 305 is connected to the stage output. Multiplier 307 connects the output of operator 305 to a second input of summing element 303. The input of stage et1 is connected to the output of modulator M, the output of stage et1 is connected to the input of stage et2, the output of stage et2 is connected to the input of stage et3, and the output of stage et3 is connected to the output of filter F. Multipliers 307 of stages et1, respectively et2, respectively et3, apply multiplication coefficients 1+α1, respectively 1+α2, respectively 1+α3.

Call U the input signal of modulator M applied to the positive input terminal of subtractor 108, Y the output signal of modulator M output by subtractor 325, and W the output signal of digital filter F.

Signals Y and W can be expressed by the following relations:

$$Y = z^{-2}U(c+z^{-1}(b-c(1+\alpha 2))) - $$
$$E2(1-(1+\alpha 1)z^{-1})(1-(1+\alpha 2)z^{-1})(1-(1+\alpha 3)z^{-1}) + $$
$$z^{-1}N1(c+z^{-1}(b-c(1+\alpha 2))) + z^{-1}N2(1-(1+\alpha 1)z^{-1}) - $$
$$N3(1-(1+\alpha 1)z^{-1})(1-(1+\alpha 2)z^{-1})$$

$$W \sim \frac{z^{-6}U}{(1-(1+\alpha 1)z^{-1})(1-(1+\alpha 2)z^{-1})(1-(1+\alpha 3)z^{-1})} - $$

-continued $$z^{-3}E2 + \frac{z^{-5}N1}{(1-(1+\alpha1)z^{-1})(1-(1+\alpha2)z^{-1})(1-(1+\alpha3)z^{-1})} +$$

$$\frac{z^{-4}N2}{(1-(1+\alpha2)z^{-1})(1-(1+\alpha3)z^{-1})} + \frac{z^{-3}N3}{(1-(1+\alpha3)z^{-1})}$$

It can be seen from the expression of W that the majority noise contribution will be related to N1. Thus, coefficient $\alpha1$ is preferably selected to be non-zero, and coefficients $\alpha2$ and $\alpha3$ may possibly be zero to simplify the forming of the converter. By selecting longer cycle times at the beginning of the conversion phase, and shorter cycle times afterwards, the passband of integrator H1 for noise N1 may be decreased at the beginning of the conversion, and then increased afterwards, to decrease the total contribution of noise N1 in the final digital output value of the converter.

Figure 21:
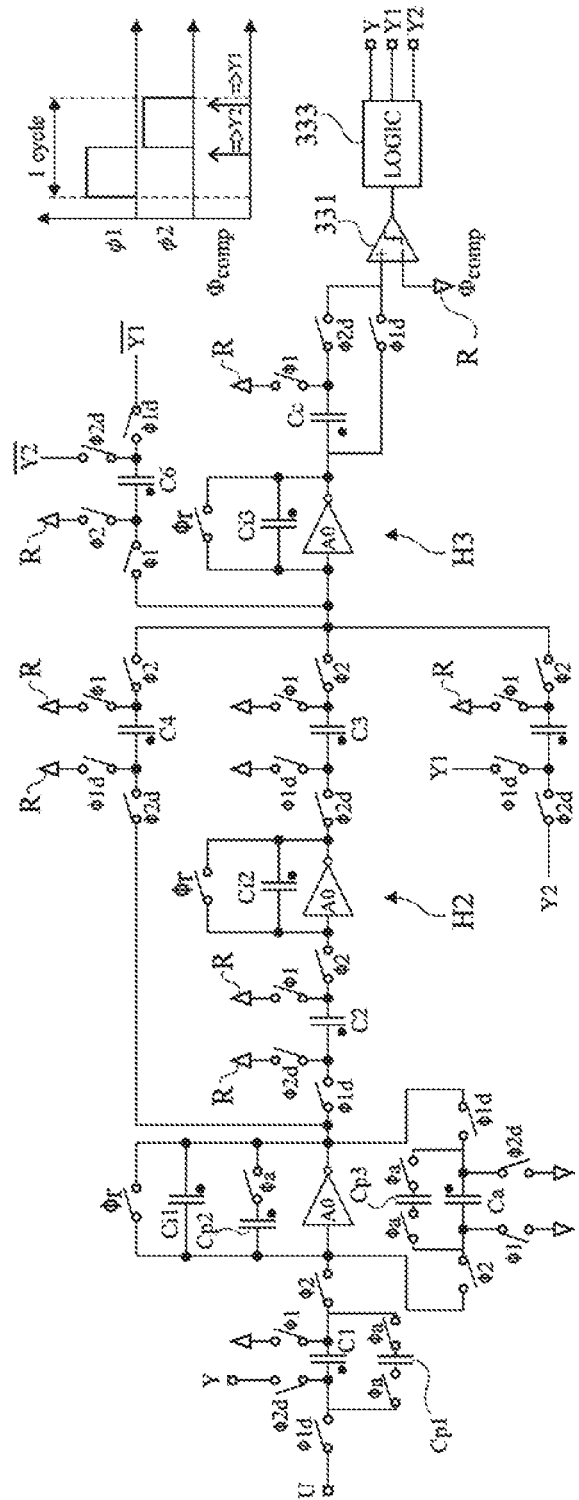
FIG. 21 is a detailed electric diagram of an embodiment of the sigma-delta modulator of the converter of FIG. 20.

FIG. 21 is a detailed electric diagram illustrating an embodiment of modulator M of the converter of FIG. 20. In this example, coefficient $\alpha1$ is non-zero and coefficients $\alpha2$ and $\alpha3$ are zero.

In the example of FIG. 21, each integrator Hj (with j in the range from 1 to 3) comprises an operational amplifier A0 having its input connected to the output by an integration capacitor Cij. The input and the output of the operational amplifier respectively form the input and the output of the integrator. Each integrator Hj further comprises, in parallel with its integration capacitor Cij, a reset switch Φr. Each integrator Hj has its input connected to a first electrode of a capacitor Cj by a switch Φ2. Each capacitor Cj further has its first electrode connected to a node R of application of a reference voltage by a switch Φ1. Capacitor C1 has its second electrode connected on the one hand to a terminal of application of input signal U of the modulator by a switch Φ1d and on the other hand to a terminal for supplying signal Y (output signal of subtractor 325 of FIG. 20) by a switch Φ2d. Each of capacitors C2 and C3 has its second electrode connected on the one hand to the output of the integrator of previous rank (j-1) by a switch Φ1d, and on the other hand to node R by a switch Φ2d. The modulator of FIG. 21 further comprises a capacitor Ca having a first electrode connected on the one hand to the input of integrator H1 by a switch Φ2 and on the other hand to node R by a switch Φ1, and having its second electrode connected on the one hand to the output of switch H1 by a switch Φ1d and on the other hand to node R by a switch Φ2d. The modulator further comprises a capacitor C5 having a first electrode connected on the one hand to the input of integrator H3 by a switch Φ2 and on the other hand to node R by a switch Φ1, and having its second electrode connected on the one hand to a node Y1 corresponding to the input of operator 324 by a switch Φ1d and on the other hand to a node Y2 corresponding to the negative input of subtractor 325 by a switch Φ2d. The modulator further comprises a capacitor C4 having a first electrode connected on the one hand to the output of integrator H1 by a switch Φ2d and on the other hand to node R by a switch Φ1d, and having its second electrode connected on the one hand to the input of integrator H3 by a switch Φ2 and on the other hand to node R by a switch Φ1. The modulator further comprises a capacitor C6 having a first electrode connected on the one hand to the input of integrator H3 by a switch Φ1 and on the other hand to node R by a switch Φ2, and having its second electrode connected on the one hand to a node $\overline{Y1}$ for supplying a signal complementary to signal Y1 by a switch Φ1d, and on the other hand to a node $\overline{Y2}$ for supplying a signal complementary to signal Y2 by a switch Φ2d. The modulator further comprises a capacitor Cc having a first electrode connected to the output of integrator H3 and having its second electrode connected to node R via a switch Φ1. The modulator further comprises a comparator 331 having an input (+) connected on the one hand to the first electrode of capacitor Cc by a switch Φ1d and on the other hand to the second electrode of capacitor Cc by a switch Φ2d. In this example, the second input (−) of comparator 331 is connected to node R. The output of comparator 331 is connected to a logic circuit 333 (LOGIC) capable of supplying signals Y, Y1, and Y2. The modulator of FIG. 21 further comprises a capacitor cp1 having its first and second electrodes respectively connected to the first and second electrodes of capacitor C by first and second switches Φa, a capacitor cp2 having its first electrode connected to the input of integrator H1 and having its second electrode connected to the output of integrator H2 by a switch Φa, and a capacitor cp3 having its first and second electrodes respectively connected to the first and second electrodes of capacitor Ca by first and second switches Φa. Although the switches switching capacitors C1, C2, C3, C4, C5, C6, Ca, Cc, Cp1, Cp2, Cp3 are different, the same designations will be used for simultaneously-switched switches.

Such a so-called SMASH 2-1 architecture comprises a modulator of order 2 formed by the series association of integrators H1 and H2, and a modulator of order 1 formed by integrator H3. The summing element of the modulator of order 2 is here implemented jointly with integrator H3 of the modulator of order 1. Thus, the quantization of the summing at the output of the modulator of order 2 is performed from the derivative of integrator H3 of the modulator of order 1. Indeed, integrator H3 receives as an input the quantization error E1 of the first modulator, having feedback Y2 subtracted thereto. As illustrated by a timing diagram in FIG. 21, each operating cycle of the modulator may be divided into two steps, one step (phase Φ2) of negative integration of the output signals of the first two integrators H1 and H2 and of feedback Y, with a quantization of the output through coupling capacitor Cc (enabling to update Y1), followed by a step (phase Φ1) of integrating difference Y1-Y2 with a quantization of the output of the integrator to update signal Y2. An advantage of the implementation of FIG. 21 is that it uses a single comparator. In this example, parameter $\alpha1>0$ is integrated within integrator H1 via a positive feedback performed by means of capacitor Ca having its value selected to be such that ratio Ca/Ci1 is equal to $\alpha1$. Switches Φa enable, when they are controlled to the on state, to increase the equivalent values of capacitances C1, respectively Ci1, respectively Ca, by values Cp1, respectively Cp2, respectively Cp3, which enables to implement a control mode where the passband of integrator H1 is decreased and where the durations of control phases Φ1, Φ1d, Φ2, Φ2d are proportionally increased. Similarly, the noise power can be varied in the different nodes of the modulator by varying the integration bands of the concerned noise, via a plurality of capacitor assemblies.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A sigma-delta converter capable of implementing a phase of conversion of an analog input signal into a digital output value, the conversion phase comprising a plurality of operating cycles, the converter comprising a sigma-delta modulator comprising at least one analog filter capable, for each cycle of the conversion phase, of receiving an internal analog signal dependent on the analog input signal and of supplying an analog output value dependent on the internal analog signal, wherein a contribution of the internal analog signal to the output value of the analog filter is smaller at a given cycle of the conversion phase than at a previous cycle of the conversion phase, the contributions at the different cycles being governed by a first predetermined law which is a first function of the rank of the cycle in the conversion phase; and wherein a duration of a given cycle of the conversion phase is shorter than a duration of a previous cycle of the conversion phase, the durations of the different cycles being governed by a second predetermined law which is a second function of the rank of the cycle in the conversion phase.

2. The sigma-delta converter of claim 1, wherein the second law is decreasing over the entire duration of the conversion phase.

3. The sigma-delta converter of claim 2, wherein the second law is decreasing in stages.

4. The sigma-delta converter of claim 1, wherein said at least one analog filter comprises at least one integration capacitor of adjustable value.

5. The sigma-delta converter of claim 4, wherein, during the conversion phase, the value of said integration capacitor varies proportionally to the cycle duration.

6. The sigma-delta converter of claim 1, wherein the modulator comprises a plurality of analog filters.

7. The sigma-delta converter of claim 6, wherein said analog filters form a plurality of chains of one or a plurality of cascaded filters, the outputs of said chains being combined to generate an output signal of the modulator.

8. The sigma-delta converter of claim 7, comprising a single 1-bit analog-to-digital converter.

9. The sigma-delta converter of claim 1, comprising at the filter input a device for weighting the internal analog signal received by the analog filter applying a variable weighting coefficient $\beta k$, which is a function of rank k of the cycle and wherein, during the conversion phase, at least two different coefficients $\beta k-1$ and $\beta k$ are applied, respectively for two successive cycles of rank k−1 and k, and wherein $\beta k-1 > \beta k$.

10. The sigma-delta converter of claim 9, wherein the variable weighting coefficient $\beta k$ decreases as rank k of the cycle increases.

11. The converter of claim 1, wherein said at least one analog filter is equivalent to a theoretical circuit comprising an element for summing the value of an analog signal received at cycle k and an internal signal of the filter corresponding to a multiplication by a coefficient 1+α of the output signal of the analog filter obtained at cycle k−1, and wherein, during the conversion phase, at least one value of coefficient α greater than zero is applied for at least one cycle.

12. The converter of claim 11, wherein coefficient α increases with rank k of the cycle.

\* \* \* \* \*